(12) United States Patent
Kim et al.

(10) Patent No.: US 10,691,625 B2
(45) Date of Patent: Jun. 23, 2020

(54) CONVERGED MEMORY DEVICE AND OPERATION METHOD THEREOF

(71) Applicant: SK hynix Inc., Icheon (KR)

(72) Inventors: Hyung-Sup Kim, Yongin (KR); Hyung-Sik Won, Cheongju (KR)

(73) Assignee: SK hynix, Inc., Icheon (KR)

( * ) Notice: Subject to any disclaimer, the term of this patent is extended or adjusted under 35 U.S.C. 154(b) by 41 days.

(21) Appl. No.: 16/136,069

(22) Filed: Sep. 19, 2018

(65) Prior Publication Data

US 2019/0155766 A1 May 23, 2019

(30) Foreign Application Priority Data

Nov. 17, 2017 (KR) .................. 10-2017-0153774

(51) Int. Cl.
| | | |
|---|---|---|
| *G11C 7/10* | (2006.01) | |
| *G11C 7/04* | (2006.01) | |
| *G06F 13/16* | (2006.01) | |
| *G06F 12/0866* | (2016.01) | |
| *G06F 12/0893* | (2016.01) | |

(52) U.S. Cl.
CPC ...... *G06F 13/1694* (2013.01); *G06F 12/0866* (2013.01); *G06F 12/0893* (2013.01); *G11C 7/04* (2013.01); *G11C 7/1072* (2013.01)

(58) Field of Classification Search
CPC ............. G06F 13/1694; G06F 12/0866; G06F 12/0893; G11C 7/04
USPC ...................................... 365/189.2
See application file for complete search history.

(56) References Cited

U.S. PATENT DOCUMENTS

| | | | |
|---|---|---|---|
| 8,918,618 B2 | 12/2014 | Fisher et al. | |
| 9,703,505 B2 | 7/2017 | Boyle et al. | |
| 2013/0227268 A1* | 8/2013 | Ichida ................ | G06F 9/448 713/100 |
| 2014/0022002 A1* | 1/2014 | Chua-Eoan ........... | H01L 23/34 327/512 |
| 2016/0162219 A1* | 6/2016 | Erez .................... | G06F 3/0653 711/103 |

\* cited by examiner

*Primary Examiner* — Anthan Tran

(57) ABSTRACT

A converged memory device includes: a first memory installed in an environment having a first temperature; a second memory installed in an environment having a second temperature that is lower than the first temperature; and a controller configured to selectively access the first memory or the second memory in response to a request.

42 Claims, 13 Drawing Sheets

CONVERGED MEMORY DEVICE AND OPERATION METHOD THEREOF

CROSS-REFERENCE TO RELATED APPLICATIONS

The present application claims priority to Korean Patent Application No. 10-2017-0153774, filed on Nov. 17, 2017, which is incorporated herein by reference in its entirety.

BACKGROUND

1. Field

Exemplary embodiments of the present disclosure relate to a converged memory device and a method for operating the converged memory device.

2. Description of the Related Art

Data are becoming important assets in the fourth industrial revolution, and the demands for new technology in support of transferring and analyzing large-scale data at a high data rate are increasing. For example, as artificial intelligence, autonomous driving, robotic, health care, virtual reality (VR), augmented reality (AR), and smart home technologies spread, demands for servers or data centers are increasing.

A legacy data center includes resources for computing, networking, and storing data, in the same equipment. However, a future large-scale data center may construct resources individually and then logically restructure the resources. For example, in the large-scale data center, the resources may be modularized at the level of racks, and the modularized resources may be restructured and supplied according to the usage. Therefore, a converged storage or memory device, which can be used for the future large-scale data center, is demanded.

SUMMARY

Embodiments of the present disclosure are directed to a converged memory device capable of supporting various performances or characteristics in a server system or a data processing system that includes a plurality of memories, and an operation method thereof.

In accordance with an embodiment of the present invention, a converged memory device includes: a first memory installed in an environment having a first temperature; a second memory installed in an environment having a second temperature that is lower than the first temperature; and a controller configured to selectively access the first memory or the second memory in response to a request.

The first memory and the second memory may be the same kind of memory.

The first temperature may be a room temperature, and the second temperature is a lower temperature than the room temperature.

The first temperature may be approximately 25° C., and the second temperature is approximately −40° C.

The first temperature may be a room temperature, and the second temperature is a cryogenic temperature.

The first temperature may be approximately 25° C., and the second temperature is approximately −197° C.

The first temperature may be a lower temperature than a room temperature, and the second temperature is a cryogenic temperature.

The first temperature is approximately −40° C., and the second temperature is approximately −197° C.

The first memory may have first characteristics, and the second memory may have second characteristics, the second characteristics being superior to the first characteristics in the environment having the second temperature.

Each of the first characteristics and the second characteristics may include one or more of a data access rate, a refresh period, and an on-chip leakage.

The first memory and the second memory may be mounted onto one among different memory blades, trays, and racks.

The controller may access the second memory when the request has a first priority, and the controller may access the first memory when the request has a second priority that is lower than the first priority.

The controller may use the second memory as a cache for the first memory.

The controller may include: a cache table configured to store an address for the cache; and an agent configured to access the second memory when an address for the request is detected in the cache table, and to access the first memory when the address for the request is absent from the cache table.

The controller may include: a first memory interface configured to interface with the first memory; a second memory interface configured to interface with the second memory; and an input/output interface configured to receive the request.

In accordance with another embodiment of the present invention, a converged memory device includes: a first memory installed in an environment having a first temperature; a second memory installed in an environment having a second temperature that is lower than the first temperature; a third memory installed in an environment having a third temperature that is lower than the second temperature; and a controller configured to selectively access one of the first memory, the second memory, and the third memory in response to a request.

The first memory, the second memory and the third memory may be the same kind of memory.

The first temperature may include a room temperature, the second temperature is a lower temperature than the room temperature, and the third temperature is a cryogenic temperature.

The first temperature may include approximately 25° C., the second temperature may include approximately −40° C., and the third temperature is approximately −197° C.

The first memory in the environment of the first temperature may have first characteristics, and the second memory in the environment of the second temperature may have second characteristics that are superior to the first characteristics, and the third memory may have third characteristics that are superior to the second characteristics in the environment having the third temperature.

The first characteristics, the second characteristics, and the third characteristics may include one or more of a data access rate, a refresh period, and an on-chip leakage.

The first memory, the second memory, and the third memory may be mounted onto one among different memory blades, trays, and racks.

The controller may access the third memory when the request has a first priority, access the second memory when the request has a second priority that is lower than the first priority, and access the first memory when the request has a third priority that is lower than the second priority.

The controller may use the third memory as a main cache for the first memory, and uses the second memory as a sub-cache for the first memory.

The controller may include: a cache table configured to store addresses for the main cache and the sub-cache; and a data controller configured to access the second memory or the third memory when an address for the request is detected in the cache table, and to access the first memory when the address for the request is absent from the cache table.

The controller may include: a first memory interface configured to interface with the first memory; a second memory interface configured to interface with the second memory; a third memory interface configured to interface with the third memory; and an input/output interface configured to receive the request.

In accordance with yet another embodiment of the present invention, a method for operating a converged memory device may include: receiving a request; and selectively accessing a first memory or a second memory in response to the request, wherein the converged memory device includes the first memory and the second memory, the first memory being installed in an environment having a first temperature, the second memory being installed in an environment having a second temperature that is lower than the first temperature.

The first memory and the second memory may be of the same kind.

The first temperature may include a room temperature, and the second temperature includes a low temperature.

The first temperature may include approximately 25° C., and the second temperature includes approximately −40° C.

The first temperature may include a room temperature, and the second temperature may include a cryogenic temperature.

The first temperature may include approximately 25° C., and the second temperature may include approximately −197° C.

The first temperature may include a low temperature, and the second temperature may include a cryogenic temperature.

The first temperature may include approximately −40° C., and the second temperature may include approximately −197° C.

The first memory may have first characteristics, and the second memory may have second characteristics, the second characteristics being superior to the first characteristics in the environment having the second temperature.

Each of the first characteristics and the second characteristics may include one or more of a data access rate, a refresh period, and an on-chip leakage.

The first memory and the second memory may be mounted onto one among different memory blades, trays and racks.

The selectively accessing a first memory or a second memory in response to the request may include: accessing the second memory when the request has a first priority; and accessing the first memory when the request has a second priority that is lower than the first priority.

The second memory may be used as a cache for the first memory.

The selectively accessing the first memory or the second memory in response to the request may include: accessing the second memory when an address for the request is an address for accessing the second memory; and accessing the first memory when the address for the request is an address for accessing the first memory.

In accordance with still another embodiment of the present invention, a method for operating a converged memory device may include: receiving a request; and selectively accessing one of a first memory, a second memory, and a third memory in response to the request, wherein the converged memory device includes the first memory, the second memory, and the third memory, the first memory being installed in an environment having a first temperature, the second memory being installed in an environment having a second temperature that is lower than the first temperature, and the third memory being installed in an environment having a third temperature that is lower than the second temperature.

The first memory, the second memory and the third memory may be the same kind of memory.

The first temperature may include a room temperature, and the second temperature may include a lower temperature than the room temperature, and the third temperature is a cryogenic temperature.

The first temperature may include approximately 25° C., and the second temperature includes approximately −40° C., and the third temperature includes approximately −197° C.

The first memory in the environment of the first temperature may have first characteristics, and the second memory in the environment of the second temperature may have second characteristics, the second characteristics being superior to the first characteristics in the environment having the second temperature, and the third memory in the environment of the third temperature may have the third characteristics being superior to the second characteristics in the environment having the third temperature.

The first characteristics, the second characteristics, and the third characteristics may include one or more of a data access rate, a refresh period, and an on-chip leakage.

The first memory, the second memory, and the third memory may be mounted onto one among different memory blades, trays and racks.

The selectively accessing one of a first memory, a second memory, and a third memory in response to the request may include: accessing the third memory when the request has a first priority; accessing the second memory when the request has a second priority that is lower than the first priority; and accessing the first memory when the request has a third priority that is lower than the second priority The third memory may be used as a main cache for the first memory, and the second memory may be used as a sub-cache for the first memory.

The selectively accessing one memory among the first memory, the second memory, and the third memory in response to the request may include: accessing the third memory when an address for the request is an address for accessing the third memory; accessing the second memory when the address for the request is an address for accessing the second memory; and accessing the first memory when the address for the request is an address for accessing the first memory.

DETAILED DESCRIPTION

Figure 1:
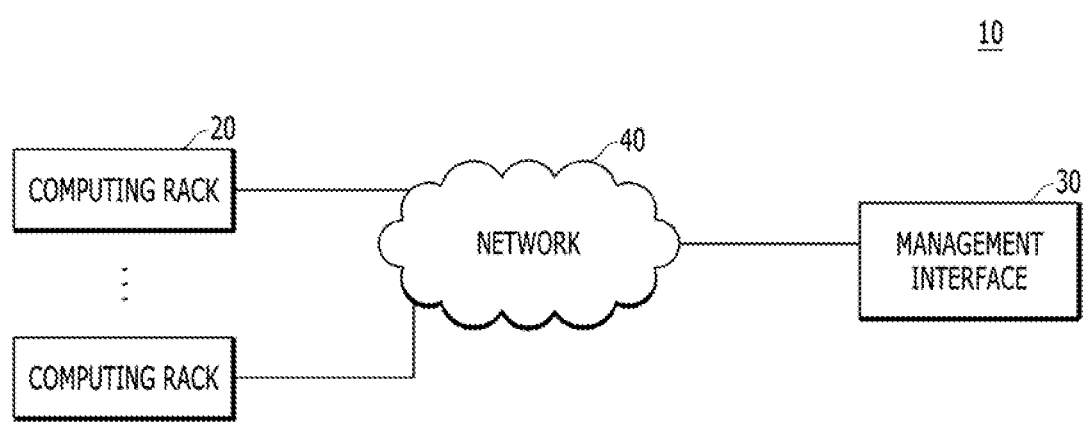
FIG. 1 is a block diagram illustrating a data processing system.

Exemplary embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments.

FIG. 1 is a block diagram illustrating a data processing system 10. Referring to FIG. 1, the data processing system 10 may include a plurality of computing racks 20, a management interface 30, and a network 40 for communication between the computing racks 20 and the management interface 30. The data processing system 10 having this rack-scale architecture may be used by a data center for processing large-scale data.

Each of the computing racks 20 may individually implement one computing device. Alternatively, each of the computing racks 20 may be combined with other computing racks to implement one computing device. The specific structures and operations of the computing racks 20 will be described later on.

The management interface 30 may provide an interactive interface for a user to control, administrate or manage the data processing system 10. The management interface 30 may be realized using an arbitrary type of a computing device that includes any of a computer, a multi-processor system, a server, a rack-mount server, a blade server, a lap-top computer, a notebook computer, a tablet computer, a wearable computing device, a network device, a web device, a distributed computing system, a processor-based system, a consumer electronic device, and so on.

According to some embodiments of the present disclosure, the management interface 30 may be realized by a distributed system having operation functions which may be performed by the computing racks 20 or having user interface functions which may be performed by the management interface 30. According to other embodiments of the present disclosure, the management interface 30 may be realized by a virtual cloud server that includes multi-computing devices distributed through the network 40. The management interface 30 may include a processor, an input/output subsystem, a memory, a data storage device, and a communication circuit.

The network 40 may transfer/receive data between the computing racks 20 and the management interface 30 and/or between the computing racks 20. The network 40 may be realized by an appropriate number of various wired and/or wireless networks. For example, the network 40 may include a publicly accessible global network, such as a wired or wireless Local Area Network (LAN), a Wide Area Network (WAN), a cellular network, and/or the Internet. In addition, the network 40 may include an appropriate number of auxiliary network devices, such as auxiliary computers, routers, and switches.

Figure 2:
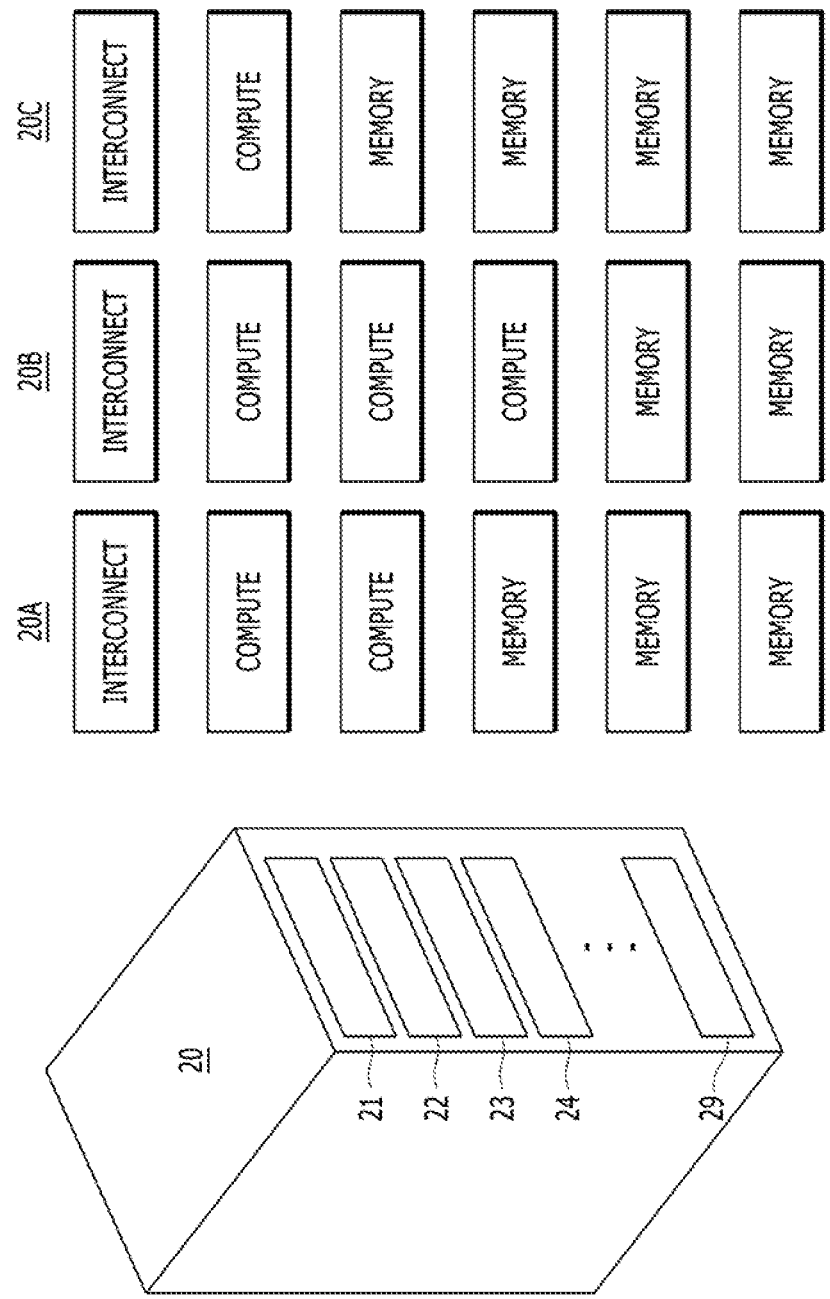
FIGS. 2 and 3 illustrate a computing device in accordance with an embodiment of the present disclosure.

FIG. 2 illustrates a computing device having a rack structure in accordance with an embodiment of the present disclosure.

Referring to FIG. 2, the computing rack 20 may include constituent elements in various forms, and structures, shapes, and names of the constituent elements are not limited. For example, the computing rack 20 may include a plurality of drawers 21 to 29. Each of the drawers 21 to 29 may include a plurality of modules, each of which may include a plurality of blades.

In various embodiments of the present disclosure, the computing rack 20 may be realized by a combination of appropriate numbers of compute blades, memory blades, and/or interconnect blades. Herein, it is defined that the computing rack 20 is realized by a combination of a plurality of blades, but the computing rack 20 may also be realized by diversely named elements such as drawers, modules, trays, boards, sashes, or units. The computing rack 20 may have a structure where the constituent elements of the computing rack 20 are disaggregated and classified according to their functions for the sake of convenience in realization. Although not limited, the computing rack 20 may have a structure of an interconnect blade, a compute blade, and a memory blade in a classification order from the top. The computing rack 20 and a computing device including the computing rack 20 may be referred to as 'a rack-scale system' or 'a disaggregated system.'

In an embodiment of the present disclosure, a computing device may be realized by one computing rack 20. In other embodiments, the computing device may be realized by all constituent elements of two or more computing racks 20, realized by some of constituent elements of two or more computing racks 20, or some of constituent elements of one computing rack 20.

In various embodiments of the present disclosure, a computing device may be realized by a combination of appropriate numbers of compute blades, memory blades, and interconnect blades that are included in the computing rack 20. As illustrated in FIG. 2, a computing rack 20A may include two compute blades, three memory blades, and one interconnect blade. A computing rack 20B may include three compute blades, two memory blades, and one interconnect blade. A computing rack 20C may include one compute blade, four memory blades, and one interconnect blade.

Although FIG. 2 illustrates a case where the computing rack 20 is realized by appropriate numbers of compute blades, memory blades, and interconnect blades, the computing rack 20 may include additional constituent elements that may be included in typical servers, such as a power system, a cooling system, an input/output device, and so on.

Figure 3:
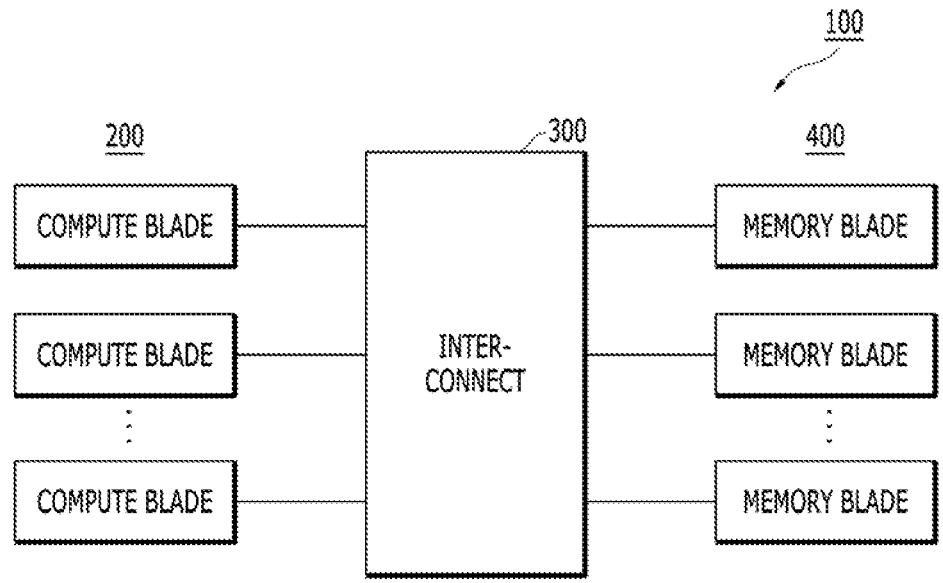

FIG. 3 illustrates a computing device 100 in accordance with an embodiment of the present disclosure.

Referring to FIG. 3, the computing device 100 may include a plurality of compute blades 200, a plurality of memory blades 400, and an interconnect blade 300. The compute blades 200 may be called pooled compute blades or pooled compute systems. Similarly, the memory blades may be called pooled memory blades or pooled memory systems. Herein, it is defined that the computing device 100 is realized by a combination of a plurality of blades, but the computing device 100 may also be realized by diversely named elements such as drawers, modules, trays, boards, sashes, or units.

Each of the compute blades 200 may include one or more of processing elements such as a processor, a processing/control circuit, a Central Processing Unit (CPU), and so on.

Each of the memory blades 400 may include one or more memories, such as volatile memories, non-volatile memories, or a combination thereof. For example, each of the memory blades 400 may include Dynamic Random Access Memories (DRAMs), flash memories, memory cards, hard disk drives (HDDs), solid state drives (SSDs), or a combination thereof.

Each of the memory blades 400 may be divided, allocated, or designated by and used by one or more processing elements that are included in each of the compute blades 200. Also, each of the memory blades 400 may store one or more operating systems (OS) that may be initialized and/or executed by the compute blades 200.

The interconnect blade 300 may include a communication circuit, a communication device, or a combination thererof, which may be divided, allocated, or designated by and used by one or more processing elements included in each of the compute blades 200. For example, the interconnect blade 300 may be realized by an arbitrary number of network interface ports, interface cards, or interface switches. The interconnect blade 300 may use protocols related to one or more wired communication technologies for communication. For example, the interconnect blade 300 may support communication between the compute blades 200 and the memory blades 400 based on one or more of protocols such as PCIe (Peripheral Component Interconnect Express), QPI (QuickPath Interconnect), Ethernet, and the like.

Figure 4:
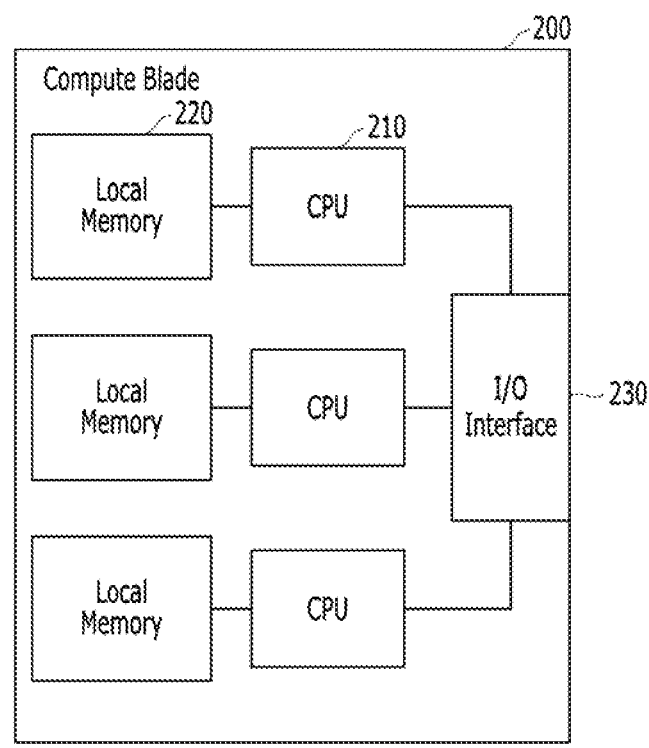
FIG. 4 is a block diagram illustrating a compute blade in accordance with an embodiment of the present disclosure.

FIG. 4 is a block diagram illustrating a compute blade 200 in accordance with an embodiment of the present disclosure.

Referring to FIG. 4, the compute blades 200 may include one or more Central Processing Units (CPUs) 210, one or more local memories 220, and an input/output (I/O) interface 230.

The CPUs 210 may divide, allocate, or designate one or more memory blades to be used, among the memory blades 400 illustrated in FIG. 3. Also, the CPUs 210 may initialize the one or more memory blades, and perform a data read operation and/or a data write (i.e., program) operation on the one or more memory blades.

The local memories 220 may store data to perform an operation of the CPUs 210. In various embodiments of the present disclosure, the local memories 220 may be a one-to-one correspondence with the CPUs 210.

The input/output interface 230 may support interfacing between the CPUs 210 and the memory blades 400 through the interconnect blade 300 of FIG. 3. The input/output interface 230 may use protocols related to one or more wired communication technologies, output and transfer data from the CPUs 210 to the interconnect blade 300, and receive data inputted from the interconnect blade 300 to the CPUs 210. For example, the input/output interface 230 may support communication between the CPUs 210 and the interconnect blade 300 using one or more of protocols such as PCIe (Peripheral Component Interconnect Express), QPI (QuickPath Interconnect), Ethernet, and the like.

Figure 5A:
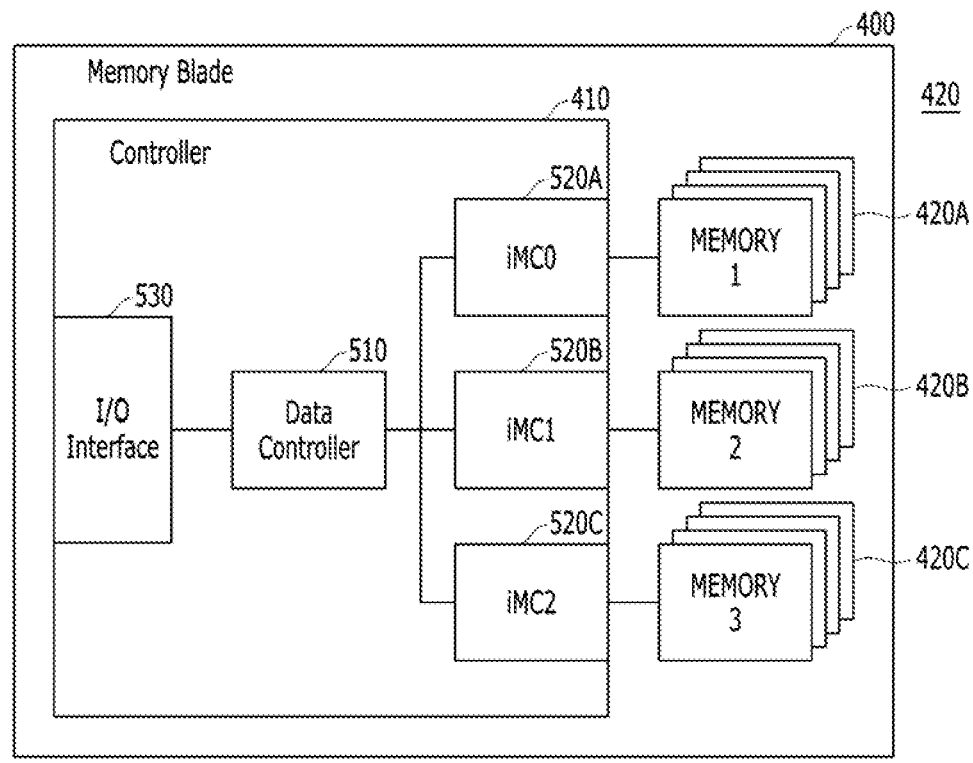
FIGS. 5A and 5B are block diagrams illustrating memory blades in accordance with embodiments of the present disclosure.
Figure 5B:
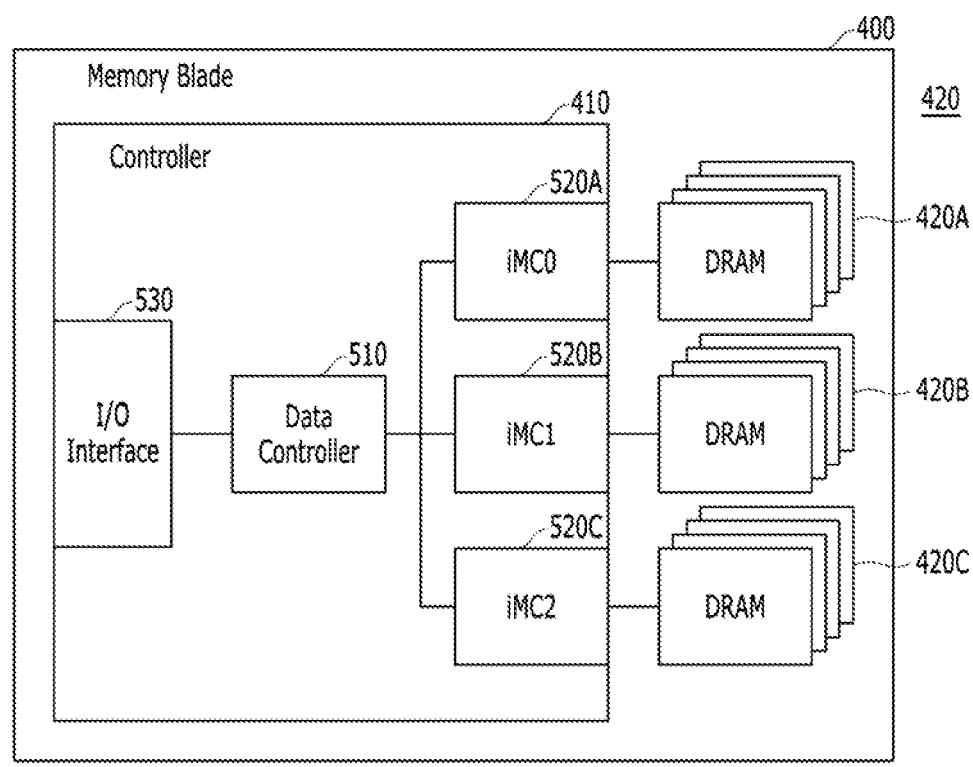

FIGS. 5A and 5B are block diagrams illustrating memory blades in accordance with embodiments of the present disclosure.

Referring to FIG. 5A, a memory blade 400 may include a controller 410 and a plurality of memories 420. The memories 420 may store (or write) data therein and output (or read out) stored data under the control of the controller 410. The memories 420 may include a first memory group 420A, a second memory group 420B, and a third memory group 420C. Each of the first, second, and third memory groups 420A, 420B, and 420C may include a multiplicity of memories. The first memory group 420A, the second memory group 420B, and the third memory group 420C may have the same characteristics or different characteristics. According to various embodiments of the present disclosure, the first memory group 420A, the second memory group 420B, and the third memory group 420C may include memories having the same characteristics or memories having different characteristics, in terms of capacity or latency.

Referring to FIG. 5B, the first memory group 420A, the second memory group 420B, and the third memory group 420C may include Dynamic Random Access Memories (DRAMs). Alternatively, the first memory group 420A, the second memory group 420B, and the third memory group 420C may include the same type of memories such as Static Random Access Memories (SRAMs) or flash memories. Also, the first memory group 420A, the second memory group 420B, and the third memory group 420C may include different types of memories.

Referring back to FIG. 5A, the controller 410 may include a data controller 510, memory controllers (MC) 520A to 520C, and an input/output (I/O) interface 530.

The data controller 510 may control data transferred and received between the memories 420 and the compute blades 200 of FIG. 3. For example, in response to a write request or command, the data controller 510 may receive write data from the compute blades 200 and control a write operation for writing the write data in a corresponding memory among the memories 420. In a read operation, in response to a read request or command, the data controller 510 may read out data stored in a particular memory among the memories 420 and control the read operation for outputting the read data to a corresponding compute blade among the compute blades 200.

The memory controllers 520A to 520C may be disposed between the data controller 510 and the memories 420, and may support interfacing between the data controller 510 and the memories 420. The memory controllers 520A to 520C may include a first memory controller (iMC0) 520A, a second memory controller (iMC1) 520B, and a third memory controller (iMC2) 520C that respectively correspond to the first memory group 420A, the second memory group 420B, and the third memory group 420C included in the memories 420. The first memory controller (iMC0) 520A may be disposed between the data controller 510 and the first memory group 420A, and may support data transfer/reception between the data controller 510 and the first memory group 420A. The memory controller (iMC1) 520B may be disposed between the data controller 510 and the second memory group 420B, and may support data transfer/reception between the data controller 510 and the second memory group 420B. The memory controller (iMC2) 520C may be disposed between the data controller 510 and the third memory group 420C, and may support data transfer/reception between the data controller 510 and the third memory group 420C. Although an example where the controller 410 includes three memory controllers, i.e., the memory controller (iMC0) 520A, the memory controller (iMC1) 520B, and the memory controller (iMC2) 520C is described herein, when the first memory group 420A, the second memory group 420B, and the third memory group 420C include DRAMs as illustrated in FIG. 5B, the controller 410 may include a single memory controller.

The input/output interface 530 may support interfacing between the data controller 510 and the compute blades 200 through the interconnect blade 300 of FIG. 3. The input/output interface 530 may use one or more protocols related to wired communication technologies, transfer read data from the data controller 510 to the interconnect blade 300, and transfer write data from the interconnect blade 300 to the data controller 510. For example, the input/output interface 530 may support communication between the data controller 510 and the interconnect blade 300 based on one or more of protocols such as Peripheral Component Interconnect Express (PCIe), QuickPath Interconnect (QPI), Ethernet, and the like.

As described above, a data processing system or a server system may have a structure in which a plurality of blades, e.g., compute blades and memory or storage blades, are discriminatively installed in a unit rack. Herein, one or more memory blades may be a converged memory device or a pooled memory in which memories of the same kind or different kinds are converged. For example, a memory blade may include a plurality of DRAMs of the same type, as illustrated in FIG. 5B. If the memories have the same type, the memories have the same characteristics. Therefore, the converged memory device may provide single performance or characteristic with respect to a request from the host, despite including a plurality of memories.

The following embodiments of the present disclosure provide a method by which a converged memory device including the same or different types of memories may provide various performances or characteristics. If it is possible to implement a converged memory device having various characteristics according to the usage environment, regardless of whether the same type or different types of memories are used in the converged memory device, a system including the converged memory device may provide various performances or characteristics by appropriately selecting and using the memories.

According to various embodiments of the present disclosure, the same type or kind of memories included in a converged memory device may have various performances or characteristics depending on various temperature environments. For example, when operating in a low temperature environment or a cryogenic environment, an operation rate of a volatile memory, such as a DRAM, may be accelerated, and as an on-chip leakage rapidly decreases, a refresh period of the volatile memory may be increased. The on-chip leakage represents an amount of leakage of stored information. The volatile memory in a low temperature environment may show similar characteristics to characteristics of a nonvolatile memory. For another example, when operating in a high temperature environment (e.g., a room temperature environment), the operation rate of the volatile memory may be slow, and power consumption of the volatile memory may increase as the on-chip leakage increases. Therefore, if memories such as DRAMs are used in various temperature environments, it will be possible to implement memories having various performances or characteristics. If memories operating in an appropriate environment are selected and used among the memories in the converged memory device, it is possible to provide performance that satisfies various application demands.

For example, when a memory operating in a low temperature environment is selected, not only a quick response to requests of relatively high priority, such as requests requiring urgent processing, but also low power consumption may be accomplished. However, generating the low temperature environment using a cooling system is costly, since the cooling system is costly. Therefore, considering the performance that may be provided by a system, only an appropriate number of memories may operate in a low temperature environment, and most of memories may operate in a normal temperature environment. The number of memories that operate in each of temperature environments may be determined appropriately according to how the system is designed.

Figure 6A:
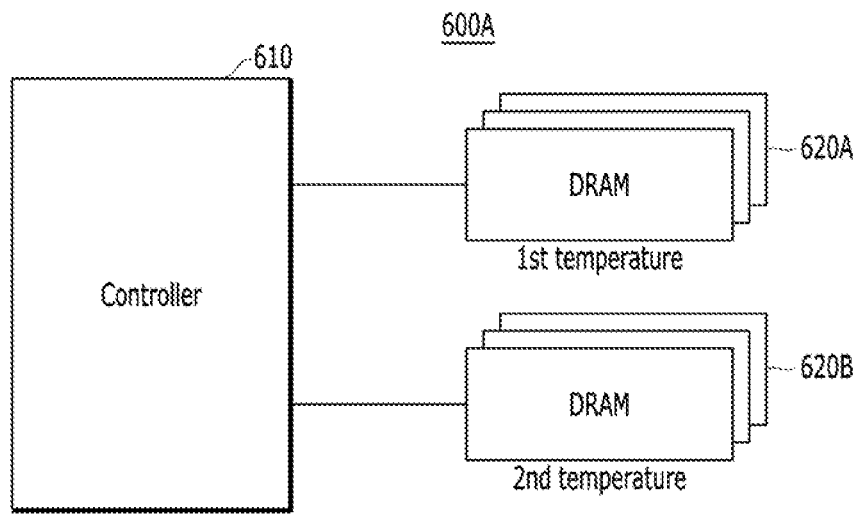
FIGS. 6A and 6B are block diagrams illustrating memory blades in accordance with embodiments of the present disclosure.
Figure 6B:
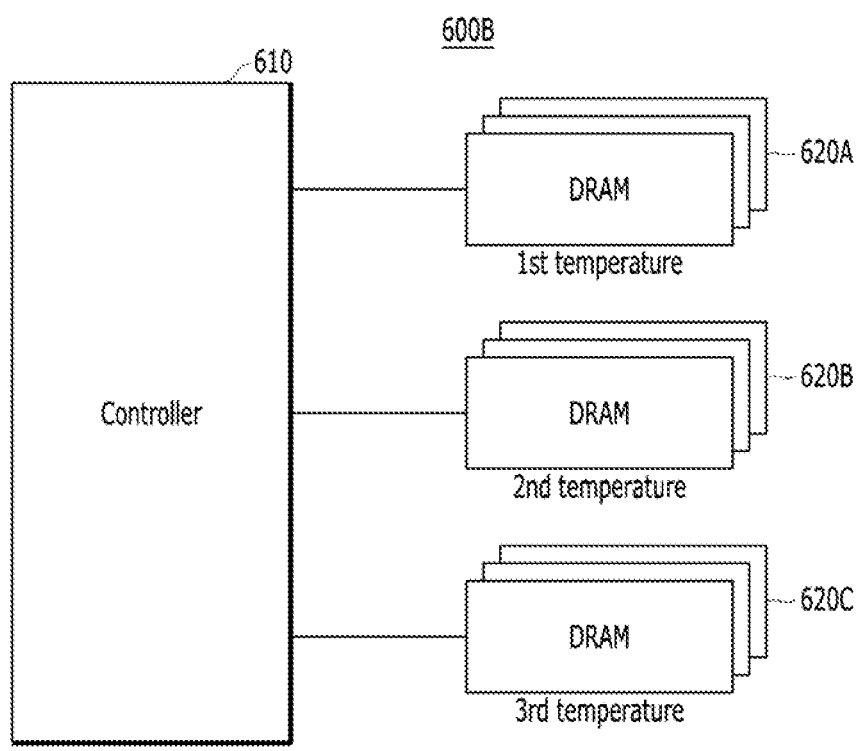

FIGS. 6A and 6B are block diagrams illustrating memory blades in accordance with embodiments of the present disclosure.

Referring to FIG. 6A, a converged memory device 600A may include a controller 610 and a plurality of memories 620A and 620B. Hereinafter, for the sake of convenience in description, it may be assumed that each of the memories 620A and 620B is a single memory. However, embodiments are not limited thereto. In another embodiment, each of the first, second, and third memories 620A, 620B, and 620C may include a plurality of memories.

The first memory 620A may be in an environment having a first temperature, and the second memory 620B may be in an environment having a second temperature.

In various embodiments of the present disclosure, the first and second memories 620A and 620B may be the same kind of DRAM, and the second temperature may be lower than the first temperature.

In an embodiment of the present disclosure, the first temperature may be a room temperature and the second temperature may be a lower temperature than the room temperature. For example, the first temperature is approximately 25° C., and the second temperature is approximately −40° C.

In another embodiment of the present disclosure, the first temperature may include the room temperature and the second temperature may include an extremely low temperature or a cryogenic temperature. For example, the first temperature is approximately 25° C., and the second temperature is approximately −197° C. (or 77 Kelvin).

In still another embodiment of the present disclosure, the first temperature may be a lower temperature than the room temperature, and the second temperature may be extremely low or cryogenic temperature. For example, the first temperature is approximately −40° C., and the second temperature is approximately −197° C.

In various embodiments of the present disclosure, the first memory 620A may have first characteristics in the environment having the first temperature, and the second memory 620B may have second characteristics that are superior to the first characteristics in the environment having the second temperature. Each of the first characteristics and the second characteristics may include one or more of a data access rate, a refresh period, and an on-chip leakage.

The controller 610 may selectively access the first memory 620A or the second memory 620B in response to a request. Herein, the request may be a request from one of the compute blades 200 shown in FIG. 3, or a request from a single host (not shown).

In various embodiments of the present disclosure, the request may be a request of a first priority or a request of a second priority, which is lower than the first priority. If the request is the request of the first priority, the controller 610 may access the second memory 620B. The controller 610 may access the first memory 620A if the request is the request of the second priority.

In various embodiments of the present disclosure, the controller 610 may use the second memory 620B as a cache for the first memory 620A. If an address for the request is a cache hit, the controller 610 may access the second memory 620B. If the address for the request is a cache miss, the controller 610 may access the first memory 620A.

Referring to FIG. 6B, a converged memory device 600B may include a controller 610 and a plurality of memories 620A, 620B, and 620C. Hereinafter, for the sake of convenience in description, it may be assumed that each of the first, second, and third memories 620A, 620B, and 620C is a single memory. However, embodiments are not limited thereto. In another embodiment, each of the first, second, and third memories 620A, 620B, and 620C may include a plurality of memories.

The first memory 620A may be in an environment having a first temperature, the second memory 620B may be in an environment having a second temperature, and the third memory 620C may be in an environment having a third temperature.

In various embodiments of the present disclosure, the memories 620A, 620B, and 620C may each be the same kind of DRAM. The second temperature may be lower than the first temperature, and the third temperature may be lower than the second temperature.

In an embodiment of the present disclosure, the first temperature may be a room temperature, and the second temperature may be a lower temperature than the room temperature, and the third temperature may be an extremely low temperature or a cryogenic temperature. For example, the first temperature is approximately 25° C., and the second temperature is approximately −40° C., and the third temperature is approximately −197° C. (or 77 Kelvin).

In various embodiments of the present disclosure, the first memory 620A may have first characteristics in the environment having the first temperature, and the second memory 620B may have second characteristics that are superior to the first characteristics in the environment having the second temperature, and the third memory 620C may have third characteristics that are superior to the second characteristics in the environment having the third temperature. Each of the first characteristics, the second characteristics, and the third characteristics may include one or more of a data access rate, a refresh period, and an on-chip leakage.

The controller 610 may selectively access one memory among the first memory 620A, the second memory 620B, and the third memory 620C in response to a request. Herein, the request may be a request from one of the compute blades 200 shown in FIG. 3, or a request from a single host (not shown).

In various embodiments of the present disclosure, the request may be a request of a first priority, a request of a second priority, which is lower than the first priority, or a request of a third priority, which is lower than the second priority. If the request is the request of the first priority, the controller 610 may access the third memory 620C. If the request is the request of the second priority, the controller 610 may access the second memory 620B. The controller 610 may access the first memory 620A if the request is the request of the third priority.

In various embodiments of the present disclosure, the controller 610 may use the second memory 620B and the third memory 620C as caches for the first memory 620A. The third memory 620C may be used as a main cache for the first memory 620A, and the second memory 620B may be used as a sub-cache for the first memory 620A. When there is no free space for storing cache data in a storing space of the third memory 620C, the second memory 620B may be used as a sub-cache for the first memory 620A. If an address for the request is a cache hit, the controller 610 may access the second memory 620B or the third memory 620C. If the address for the request is a cache miss, the controller 610 may access the first memory 620A.

Figure 7A:
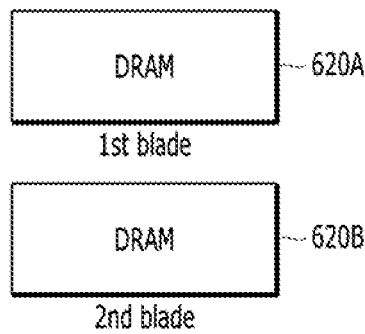
FIGS. 7A to 7C illustrate how memories are mounted in accordance with embodiments of the present disclosure.
Figure 7B:
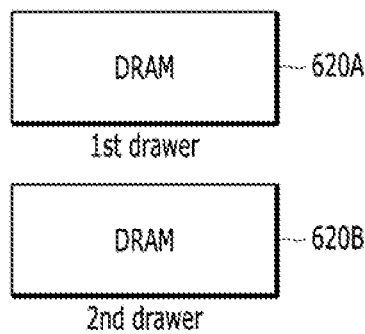
Figure 7C:
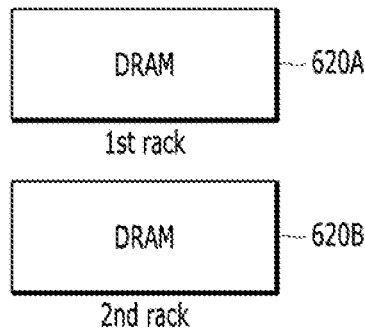

FIGS. 7A to 7C exemplarily illustrate how memories are mounted in accordance with an embodiment of the present disclosure.

Referring to FIG. 7A, the first memory 620A and the second memory 620B may be mounted on different blades. The first memory 620A may be mounted on a first blade in a first temperature environment, and the second memory 620B may be mounted on a second blade in a second temperature environment.

Referring to FIG. 7B, the first memory 620A and the second memory 620B may be mounted in different drawers. The first memory 620A may be mounted in a first drawer in a first temperature environment, and the second memory 620B may be mounted in a second drawer in a second temperature environment.

Referring to FIG. 7C, the first memory 620A and the second memory 620B may be mounted in different racks. The first memory 620A may be mounted in a first rack in a first temperature environment, and the second memory 620B may be mounted in a second rack in a second temperature environment.

FIGS. 7A to 7C show that the first memory 620A and the second memory 620B shown in FIG. 6A may be in various temperature environments. Similarly, the first memory 620A, the second memory 620B, and the third memory 620C shown in FIG. 6B may be in various temperature environments, e.g., mounted in one of memory blades, trays, and racks in different thermal conditions. Thus, when the memories 620A, 620B, and 620C are in various temperature environments, the memories 620A, 620B, and 620C may have various performances or characteristics.

Since a memory having appropriate performance or characteristics for a request may be selected among a plurality of memories, a converged memory device or a pooled memory system may manage memory resources according to the needs of an application. For example, in a case of a request that requires the best system performance, a memory that represents the best performance may be selected among the plurality of memories in the converged memory device. In a case of a request for good system performance, a memory representing good performance may be selected among the plurality of memories in the converged memory device. In a case of a request for good system performance, a memory. In a case of a request for normal system performance, a memory representing normal performance among the plurality of memories in the converged memory device may be selected. Also, a memory that supports a high speed may be used as a cache for a memory that supports a normal operation rate.

Figure 8:
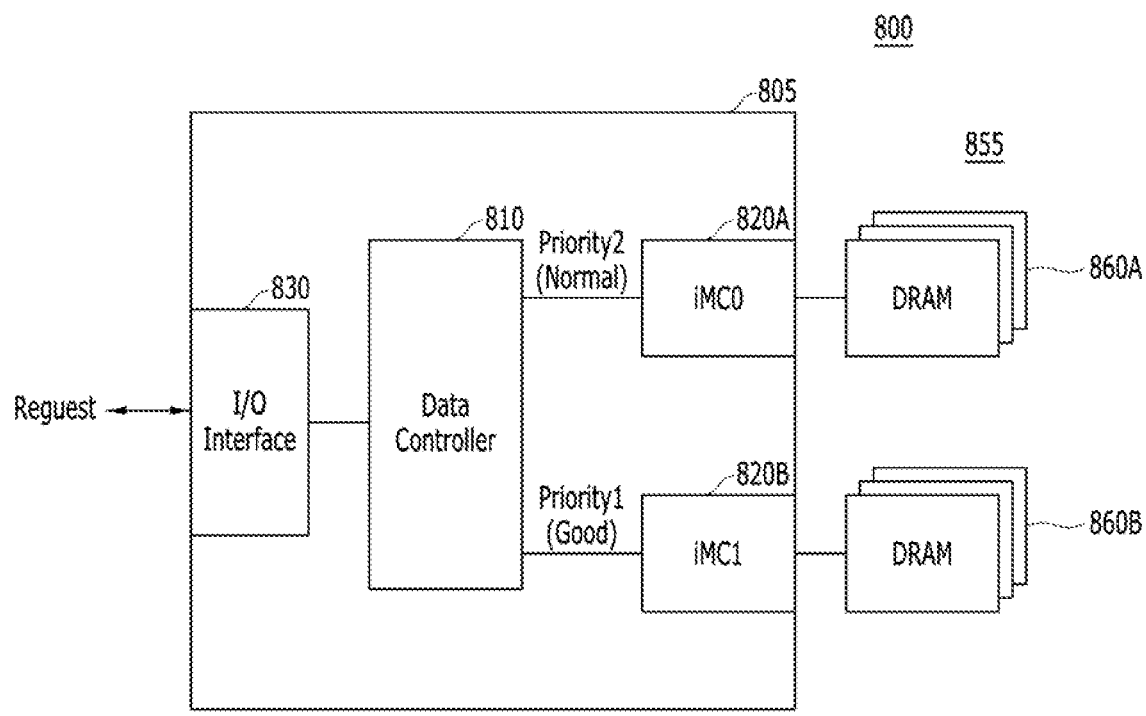
FIG. 8 is a block diagram illustrating a memory device that includes a controller in accordance with an embodiment of the present disclosure.

FIG. 8 is a block diagram illustrating a memory device 800 including a controller in accordance with an embodiment of the present disclosure.

Referring to FIG. 8, the memory device 800 may include a controller 805 and a plurality of memories 855. The plurality of memories 855 include first memories 860A and second memories 860B. Hereinafter, for the sake of convenience in description, it may be assumed that each of the memories 860A and 860B is a single memory.

A first memory 860A may be in an environment having a first temperature, and a second memory 860B may be in an environment having a second temperature.

In various embodiments of the present disclosure, the first and second memories 860A and 860B may be the same kind of DRAM. The second temperature may be lower than the first temperature.

In an embodiment of the present disclosure, the first temperature may be a room temperature, and the second temperature may be a lower temperature than the room temperature. For example, the first temperature is approximately 25° C., and the second temperature is approximately −40° C.

In another embodiment of the present disclosure, the first temperature may be the room temperature, and the second temperature may be an extremely low temperature or a cryogenic temperature. For example, the first temperature is approximately 25° C., and the second temperature is approximately −197° C.

In still another embodiment of the present disclosure, the first temperature may be a lower temperature than the room temperature, and the second temperature may be an extremely low temperature or a cryogenic temperature. For example, the first temperature is approximately −40° C., and the second temperature is approximately −197° C.

In various embodiments of the present disclosure, the first memory 620A may have first characteristics in the environment having the first temperature, and the second memory 620B may have second characteristics that are superior to the first characteristics in the environment having the second temperature. Each of the first characteristics and the second characteristics may include one or more of a data access rate, a refresh period, and an on-chip leakage.

The controller 805 may selectively access the first memory 860A or the second memory 860B in response to a request. Herein, the request may be a request from one of the compute blades 200 shown in FIG. 3, or a request from a single host (not shown). Hereafter, an example in which the request may be received from the host is described. The request may include priority information. For example, the priority information may represent priorities for requests, e.g., normal, good, or best. For another example, various types of memories may be used for one blade, and may be sorted out based on an operation rate, such as a fast, typical, or slow operation rate, or may be sorted out based on status characteristics, such as storage capability, e.g., a best, good, or normal storage capability. In this case, a request or a signal received from the host may correspond to each memory.

The controller 805 may include a data controller 810, a first memory controller (iMC0) 820A, a second memory controller (iMC1) 820B, and an input/output (I/O) interface 830.

The data controller 810 may receive a request, and access the first memory 860A through the first memory controller (iMC0) 820A or the second memory 860B through the second memory controller (iMC1) 820B in response to the request. The request may be a request of a first priority or a request of a second priority, the second priority being lower than the first priority. If the request is the first priority request (e.g., good), the data controller 810 may access the second memory 620B through the second memory controller (iMC1) 820B. If the request is the second priority request (e.g., normal) having a lower priority than the first priority request, the data controller 810 may access the first memory 620A through the first memory controller (iMC0) 820A.

The first memory controller (iMC0) 820A may be a memory interface for interfacing with the first memory 860A. The second memory controller (iMC1) 820B may be a second memory interface for interfacing with the second memory 860B. The input/output interface 830 is for interfacing with the host, and the input/output interface 830 may transfer a request from the host to the data controller 810 and may transfer data received from the data controller 810 to the host.

Figure 9:
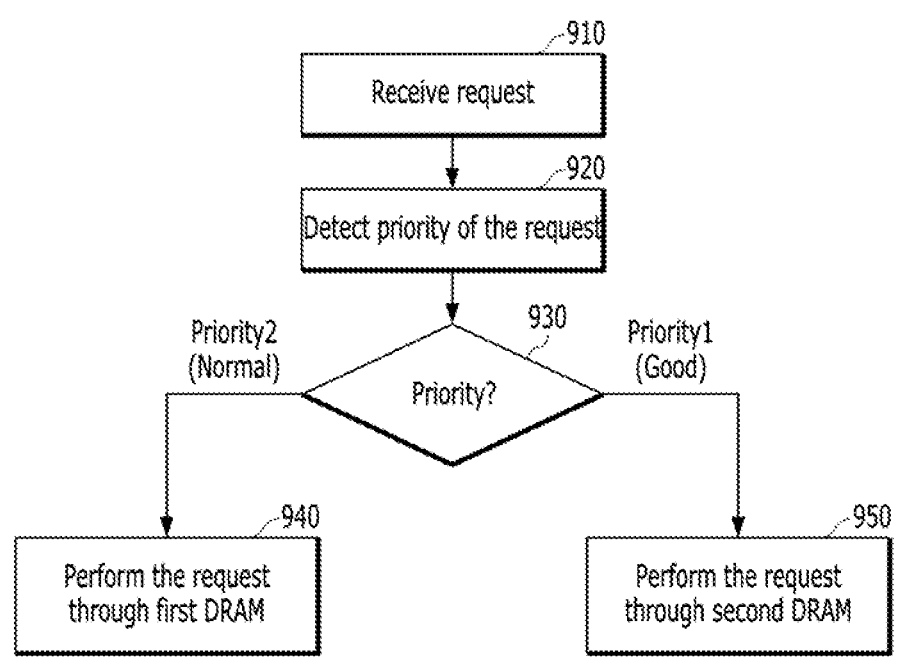
FIG. 9 is a flowchart illustrating an operation of a memory device that includes a controller in accordance with an embodiment of the present disclosure.

FIG. 9 is a flowchart illustrating an operation of a memory device including a controller in accordance with an embodiment of the present disclosure. For example, FIG. 9 illustrates an operation performed in the memory device 800 including the controller 805, the first memory 860A, and the second memory 860B, which are shown in FIG. 8.

Referring to FIG. 9, the controller 805 may receive a request from the host in step 910, and detect a priority of the received request in step 920. The controller 805 may access the first memory 860A through the first memory controller (iMC0) 820A or access the second memory 860B through the second memory controller (iMC1) 820B in response to the detected priority of the received request. The request may be a request of a first priority or a request of a second priority, the second priority being lower than the first priority. If the request is the first priority request, the data controller 810 may access the second memory 620B through the second memory controller (iMC1) 820B in step 950. If the request is the second priority request, the data controller 810 may access the first memory 620A through the first memory controller (iMC0) 820A in step 940.

Figure 10:
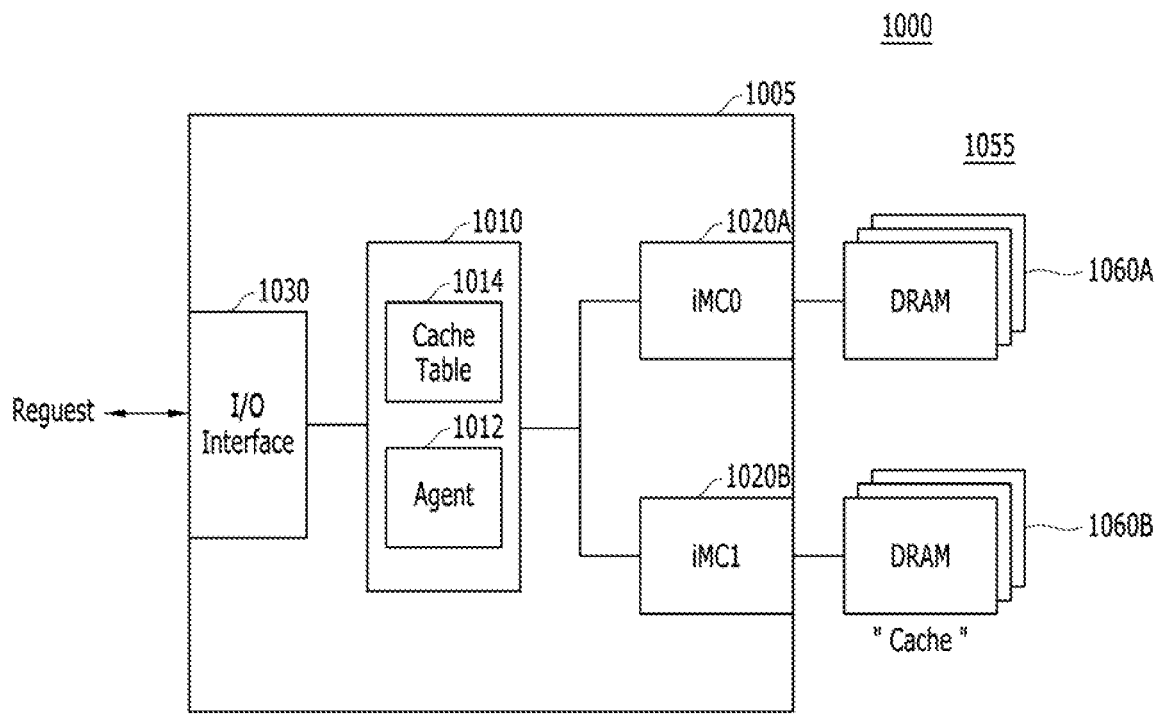
FIG. 10 is a block diagram illustrating a memory device that includes a controller in accordance with an embodiment of the present disclosure.

FIG. 10 is a block diagram illustrating a memory device 1000 including a controller in accordance with an embodiment of the present disclosure.

Referring to FIG. 10, the memory device 1000 may include a controller 1005 and a plurality of memories 1055. The plurality of memories 1055 include first memories 1060A and second memories 1060B. Hereinafter, for the sake of convenience in description, it may be assumed that each of the first and second memories 1060A and 1060B is a single memory.

A first memory 1060A may be in an environment having a first temperature, and a second memory 1060B may be in an environment having a second temperature.

In various embodiments of the present disclosure, the first and second memories 1060A and 1060B may be the same kind of DRAM. The second temperature may be lower than the first temperature.

In an embodiment of the present disclosure, the first temperature may be a room temperature, and the second temperature may be a lower temperature than the room temperature. For example, the first temperature is approximately 25° C., and the second temperature is approximately −40° C.

In another embodiment of the present disclosure, the first temperature may be the room temperature, and the second temperature may be an extremely low temperature or a cryogenic temperature. For example, the first temperature is approximately 25° C., and the second temperature is approximately −197° C.

In still another embodiment of the present disclosure, the first temperature may be a lower temperature than the room temperature, and the second temperature may be an extremely low temperature or a cryogenic temperature. For example, the first temperature is approximately −40° C., and the second temperature is approximately −197° C.

In various embodiments of the present disclosure, the first memory 1060A may have first characteristics in the environment having the first temperature, and the second memory 1060B may have second characteristics that are superior to the first characteristics in the environment having the second temperature. Each of the first characteristics and the second characteristics may include one or more of a data access rate, a refresh period, and an on-chip leakage.

The controller 1005 may selectively access the first memory 1060A or the second memory 1060B in response to a request. Herein, the request may be a request from one of the compute blades 200 shown in FIG. 3, or a request from a single host (not shown). Hereafter, an example in which the request is received from the host may be described.

The controller 1005 may include a data controller 1010, a first memory controller (iMC0) 1020A, a second memory controller (iMC1) 1020B, and an input/output (I/O) interface 1030. The controller 1005 may use the second memory 1060B as a cache for the first memory 1060A.

The data controller 1010 may include an agent 1012 and a cache table 1014. The cache table 1014 may store address information for the second memory 1060B, which stores cache data for the first memory 1060A. For example, the cache table 1014 may store physical address information for the second memory 1060B.

The agent 1012 may perform an access operation to the first memory 1060A or the second memory 1060B in response to a request received through the input/output interface 1030. The agent 1012 may select one of the first memory 1060A and the second memory 1060B, and may perform an access operation to the selected memory according to whether an address for the request is detected in the cache table 1014. If the address for the request is detected in the cache table 1014, the agent 1012 may access the second memory 1060B through the second memory controller (iMC1) 1020B. On the other hand, if the address for the request is not detected in the cache table 1014, the agent 1012 may access the first memory 1060A through the first memory controller (iMC0) 1020A. In various embodiments, if address information included in the request corresponds to a logical address, the agent 1012 may perform an address conversion operation that converts the logical address into a physical address, which can be used for accessing the first memory 1060A or the second memory 1060B.

The first memory controller (iMC0) 1020A may be a memory interface for interfacing with the first memory 860A. The second memory controller (iMC1) 820B may be a second memory interface for interfacing with the second memory 1060B. The input/output interface 1030 is for interfacing with the host. The input/output interface 1030 may transfer a request from the host to the data controller 1010 and transfer data received from the data controller 1010 to the host.

Figure 11:
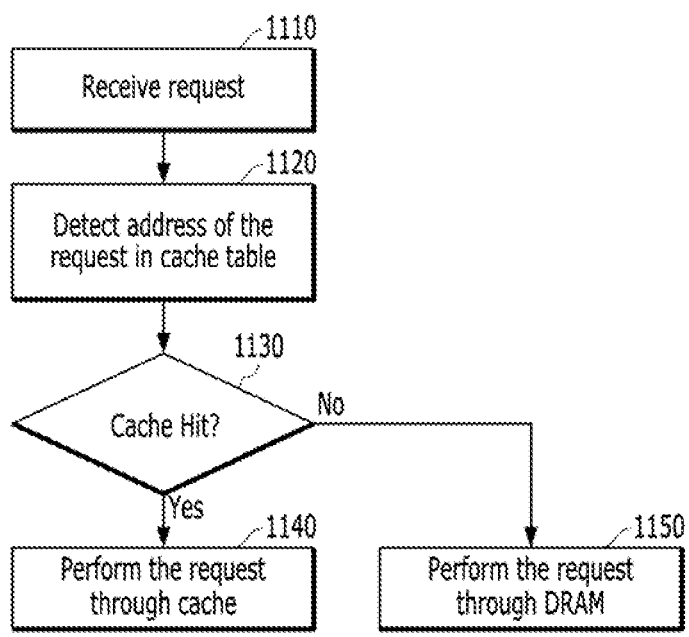
FIG. 11 is a flowchart illustrating an operation of a memory device that includes a controller in accordance with an embodiment of the present disclosure.

FIG. 11 is a flowchart illustrating an operation of a memory device that includes a controller in accordance with an embodiment of the present disclosure. For example, FIG. 11 illustrates an operation performed in the memory device 1000 including the controller 1005, the first memory 1060A, and the second memory 1060B, which are shown in FIG. 10.

Referring to FIG. 11, the controller 1005 may receive a request from the host in step 1110. The controller 1005 may confirm whether an address of the received request is detected from the cache table 1014 in step 1120.

If the address for the received request is detected from the cache table 1014 in step 1130 (Y), i.e., the received request corresponds to a cache hit, the controller 1005 may perform an operation corresponding to the request on the second memory 1060B, which is a cache for the first memory 1060A, in step 1140.

On the other hand, if the address for the request is not detected in the cache table 1014, i.e., the received request corresponds to a cache miss, the controller 1005 may perform the operation corresponding to the request on the first memory 1060A in step 1150.

Figure 12:
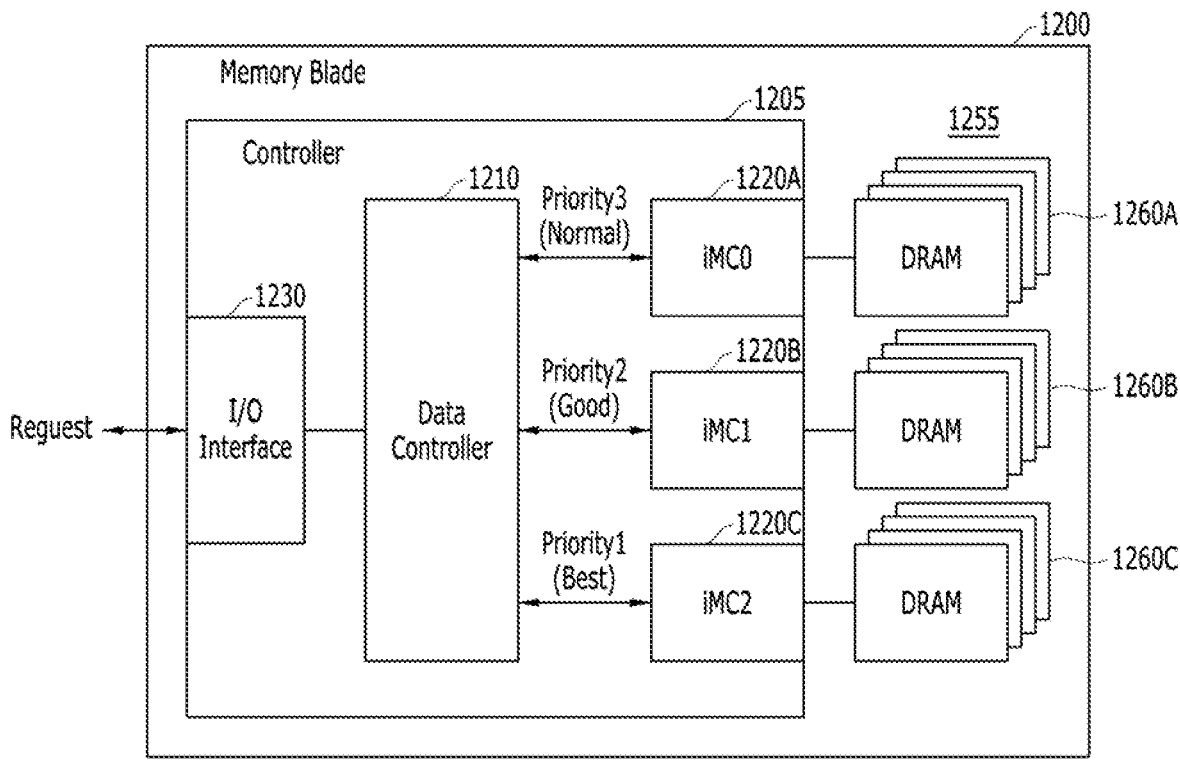
FIG. 12 is a block diagram illustrating a memory device that includes a controller in accordance with an embodiment of the present disclosure.

FIG. 12 is a block diagram illustrating a memory device 1200 including a controller in accordance with an embodiment of the present disclosure.

Referring to FIG. 12, the memory device 1200 may include a controller 1205 and a plurality of memories 1255. The plurality of memories 1255 include first memories 1260A, second memories 1260B, and third memories 1260C. Hereinafter, for the sake of convenience in description, it may be assumed that each of the first, second, and third memories 1260A, 1260B, and 1260C is a single memory.

A first memory 1260A may be in an environment having a first temperature, and a second memory 1260B may be in an environment having a second temperature, and a third memory 1260C may be in an environment having a third temperature.

In various embodiments of the present disclosure, the first, second, and third memories 1260A, 1260B, and 1260C may be the same kind of DRAM. The second temperature may be lower than the first temperature, and the third temperature may be lower than the second temperature.

In an embodiment of the present disclosure, the first temperature may be a room temperature, and the second temperature may be a lower temperature than the room temperature, and the third temperature may include an extremely low temperature or a cryogenic temperature. For example, the first temperature is approximately 25° C., and the second temperature is approximately −40° C., and the third temperature is approximately −197° C.

In various embodiments of the present disclosure, the first memory 1260A may have first characteristics in the environment having the first temperature, the second memory 1260B may have second characteristics that are superior to the first characteristics in the environment having the second temperature, and the third memory 1260C may have third characteristics that are superior to the second characteristics in the environment having the third temperature. Each of the first characteristics, the second characteristics, and the third characteristics may include one or more of a data access rate, a refresh period, and an on-chip leakage.

The controller 1205 may selectively access one of the first memory 1260A, the second memory 1260B, and the third memory 1260C in response to a request. Herein, the request may be a request from one of the compute blades 200 shown in FIG. 3, or a request from a single host (not shown). Hereafter, an example in which the request is received from the host may be described. The request may include priority information. For example, the priority information may represent a priority for the request, e.g., normal, good, or best.

The controller 1205 may include a data controller 1210, a first memory controller (iMC0) 1220A, a second memory controller (iMC1) 1220B, a third memory controller (iMC2) 1220C, and an input/output (I/O) interface 1230.

The data controller 1210 may receive a request and access the first memory 1260A through the first memory controller (iMC0) 1220A, the second memory 1260B through the second memory controller (iMC1) 1220B, or the third memory 1260C through the third memory controller (iMC2) 1220C in response to the request. The request may be a request of a first priority, a request of a second priority that is lower than the first priority, or a request of a third priority that is lower than the second priority. If the request is the first priority request (e.g., best), the data controller 1210 may access the third memory 1260C through the third memory controller (iMC2) 1220C. If the request is the second priority request (e.g., good), the data controller 1210 may access the second memory 1260B through the second memory controller (iMC1) 1220B. If the request is the third priority request (e.g., normal), the data controller 1210 may access the first memory 1220A through the first memory controller (iMC0) 1220A.

The first memory controller (iMC0) 1220A may be a memory interface for interfacing with the first memory 1260A. The second memory controller (iMC1) 1220B may be a memory interface for interfacing with the second memory 1260B. The third memory controller (iMC2) 1220C may be a memory interface for interfacing with the third memory 1260C. The input/output interface 1230 is for interfacing with the host, and the input/output interface 1230 may transfer a request from the host to the data controller 1210 and may transfer data received from the data controller 1210 to the host.

Figure 13:
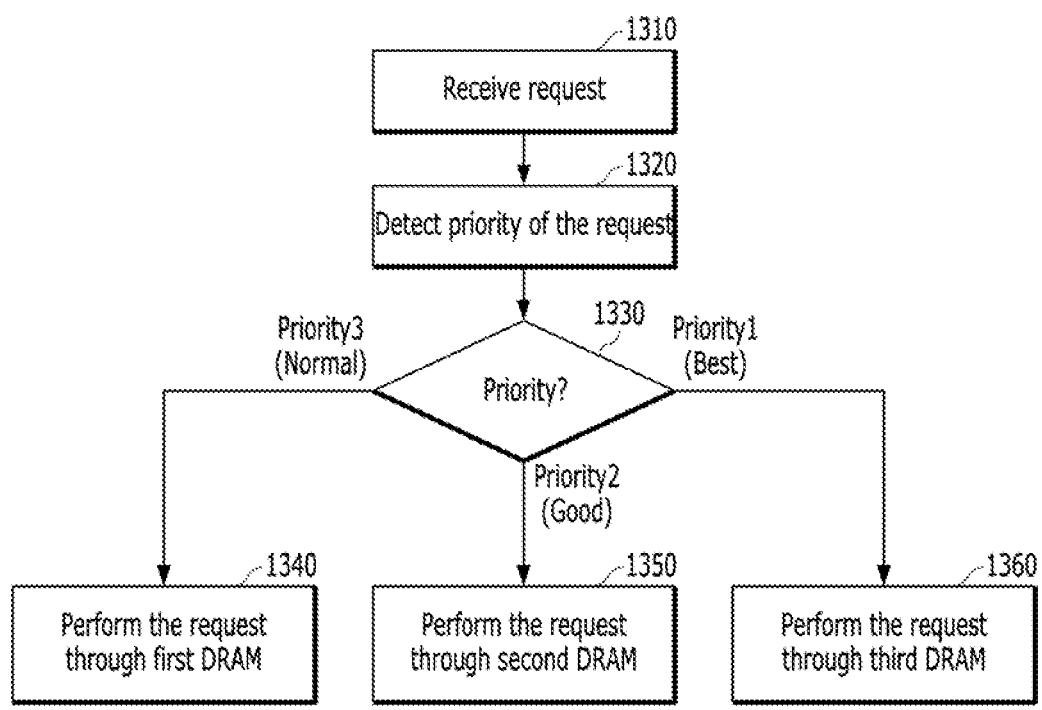
FIG. 13 is a flowchart illustrating an operation of a memory device that includes a controller in accordance with an embodiment of the present disclosure.

FIG. 13 is a flowchart illustrating an operation of a memory device that includes a controller in accordance with an embodiment of the present disclosure. For example, FIG. 13 illustrates an operation performed in the memory device 1200 including the controller 1205, the first memory 1260A, the second memory 1260B, and the third memory 1260C, which are shown in FIG. 12.

Referring to FIG. 13, the controller 1205 may receive a request from the host in step 1310. The controller 1205 may detect a priority of the received request in step 1320. The controller 1205 may access the first memory 1260A through the first memory controller (iMC0) 1220A, access the second memory 1260B through the second memory controller (iMC1) 1220B, or access the third memory 1260C through the third memory controller (iMC2) 1220C in response to the detected priority of the received request.

The request may be a request of a first priority, a request of a second priority, which is lower than the first priority, or a request of a third priority, which is lower than the second priority. If the request is the first priority request (e.g., best), the data controller 1210 may access the third memory 1220C through the third memory controller (iMC2) 1220C in step 1360. If the request is the second priority request (e.g., good), the data controller 1210 may access the second memory 1220B through the second memory controller (iMC1) 1220B in step 1350. If the request is the third priority request (e.g., normal), the data controller 1210 may access the first memory 1220A through the first memory controller (iMC0) 1220A in step 1340.

Figure 14A:
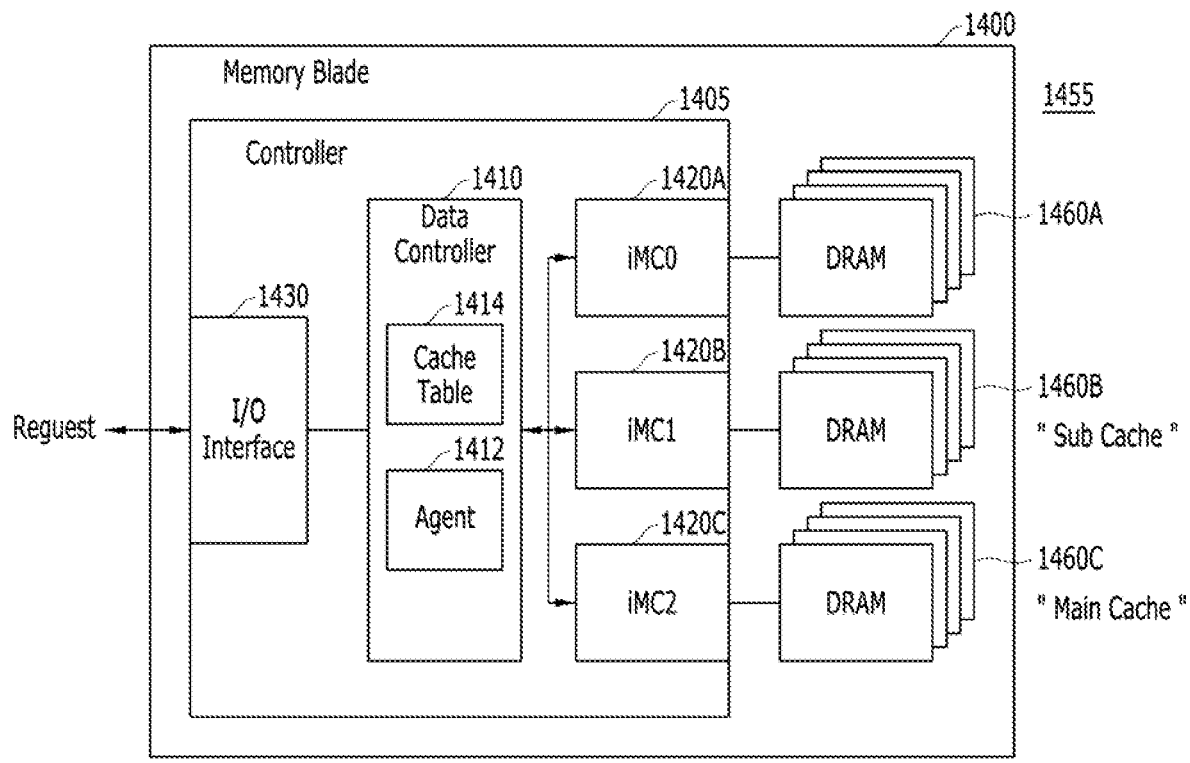
FIG. 14A is a block diagram illustrating a memory device that includes a controller in accordance with an embodiment of the present disclosure.

FIG. 14A is a block diagram illustrating a memory device including a controller in accordance with an embodiment of the present disclosure.

Referring to FIG. 14A, the memory device 1400 may include a controller 1405 and a plurality of memories 1455. The plurality of memories 1455 include first memories 1460A, second memories 1460B, and third memories 1460C. Hereinafter, for the sake of convenience in description, it may be assumed that each of the first, second, and third memories 1460A, 1460B, and 1460C is a single memory.

A first memory 1460A may be in an environment having a first temperature, a second memory 1460B may be in an environment having a second temperature, and a third memory 1460C may be in an environment having a third temperature.

In various embodiments of the present disclosure, the first, second, and third memories 1460A, 1460B, and 1460C may be the same kind of DRAMs. The second temperature may be lower than the first temperature, and the third temperature may be lower than the second temperature.

In an embodiment of the present disclosure, the first temperature may be a room temperature, the second temperature may be a lower temperature than the room temperature, and the third temperature may be an extremely low temperature or a cryogenic temperature. For example, the first temperature is approximately 25° C., the second temperature is approximately −40° C., and the third temperature is approximately −197° C.

In various embodiments of the present disclosure, the first memory 1460A may have first characteristics in the environment having the first temperature, the second memory 1460B may have second characteristics that are superior to the first characteristics in the environment having the second temperature, and the third memory 1460C may have third characteristics that are superior to the second characteristics in the environment having the third temperature. Each of the first characteristics, the second characteristics, and the third characteristics may include one or more of a data access rate, a refresh period, and an on-chip leakage.

The controller 1405 may selectively access one of the first memory 1460A, the second memory 1460B, and the third memory 1460C in response to a request. Herein, the request may be a request from one of the compute blades 200 shown in FIG. 3, or a request from a single host (not shown). Hereafter, an example in which the request is received from the host may be described. The request may include priority information. For example, the priority information may represent priorities for requests, e.g., normal, good, or best.

The controller 1405 may include a data controller 1410, a first memory controller (iMC0) 1420A, a second memory controller (iMC1) 1420B, a third memory controller (iMC2) 1420C, and an input/output (I/O) interface 1430. The controller 1405 may use the second memory 1460B and the third memory 1460C as caches for the first memory 1460A. The third memory 1460C may be used as a main cache for the first memory 1460A, and the second memory 1460B may be used as a sub-cache for the first memory 1460A. When there is no free space for storing cache data in a storage space of the third memory 1460C, the second memory 1460B may be used as a sub-cache for the first memory 1460A.

The data controller 1410 may include an agent 1412 and a cache table 1414. The cache table 1414 may store address information for the second memory 1460B and/or the third memory 1460C that store cache data for the first memory 1460A. For example, the cache table 1414 may store physical address information for the second memory 1460B and/or the third memory 1460C.

The agent 1412 may selectively access one of the first memory 1460A, the second memory 1460B, and the third memory 1460C in response to a request received through the input/output interface 1430. The agent 1412 may select one of the first memory 1460A, the second memory 1460B, and the third memory 1460C, and perform an access operation on the selected memory according to whether an address for the request is detected in the cache table 1414.

If the address for the request is detected in the cache table 1414, the agent 1412 may access the third memory 1460C through the third memory controller (iMC2) 1420C or access the second memory 1460B through the second memory controller (iMC1) 1420B. On the other hand, if the address for the request is not detected in the cache table 1414, the agent 1412 may access the first memory 1460A through the first memory controller (iMC0) 1420A. In various embodiments of the present disclosure, if address information included in the request corresponds to a logical address, the agent 1412 may perform an address conversion operation to convert the logical address into a physical address for the first memory 1460A, the second memory 1460B, or the third memory 1460C.

The first memory controller (iMC0) 1420A may be a memory interface for interfacing with the first memory 1460A. The second memory controller (iMC1) 1420B may be a memory interface for interfacing with the second memory 1460B. The third memory controller (iMC2) 1420C may be a memory interface for interfacing with the third memory 1460C. The input/output interface 1430 is for interfacing with the host, and the input/output interface 1430 may transfer a request from the host to the data controller 1410 and transfer data received from the data controller 1410 to the host.

FIGS. 14B to 14E are block diagrams illustrating an operation of a memory device including a controller in accordance with an embodiment of the present disclosure. The operation described in FIGS. 14B to 14E may be performed by the agent 1412 and the cache table 1414 in the memory device 1400, which are illustrated in FIG. 14A.

This operation may correspond to an embodiment in which one of the memories, e.g., the third DRAM 1460C, is used as a main cache for another memory, e.g., the first DRAM 1460A, and the other memory, e.g., the second DRAM 1460B, is selectively used as a sub-cache for the other memory, e.g., the first DRAM 1460A. When the third DRAM 1460C is used in a cryogenic environment, the on-chip leakage of the third DRAM 1460C may be rapidly reduced, which greatly increases a refresh period. Therefore, the third DRAM 1460C may have characteristics similar to characteristics of a non-volatile memory or a Static Random Access Memory (SRAM), and due to the improved characteristics, the third DRAM 1460C can be used as a cache for another DRAM.

Figure 14B:
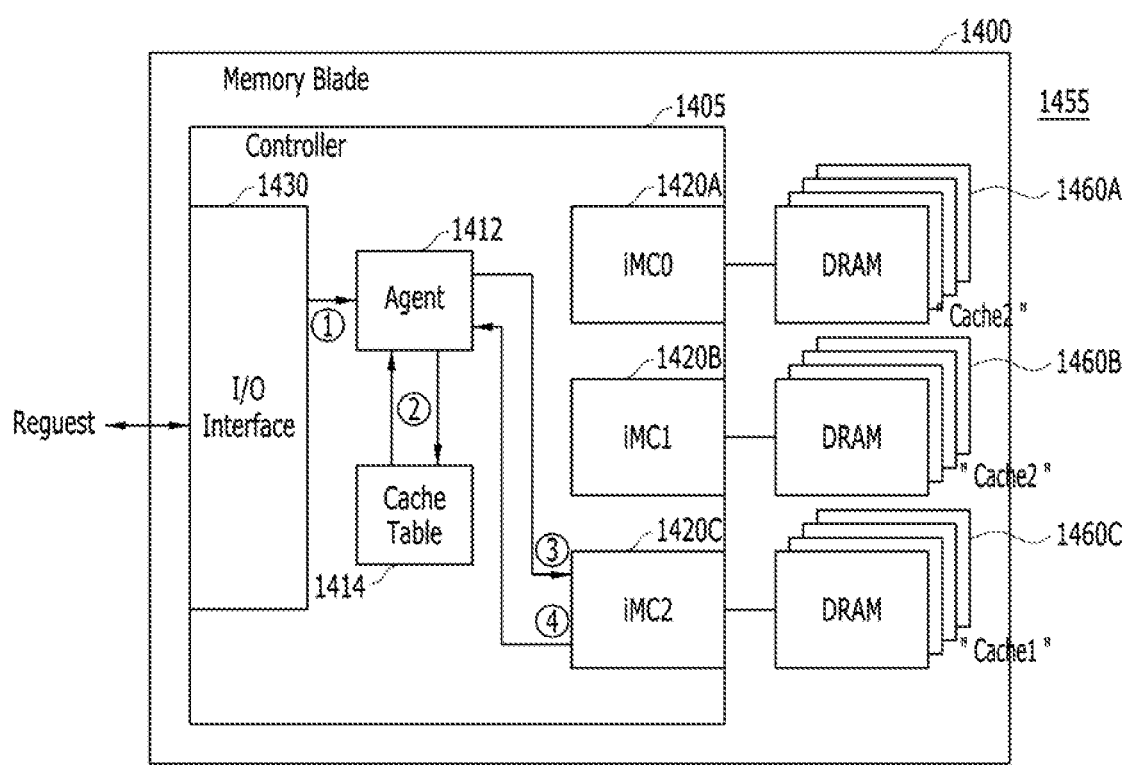
FIGS. 14B to 14E are block diagrams illustrating an operation of a memory device that includes a controller in accordance with an embodiment of the present disclosure.

Referring to FIG. 14B, the agent 1412 may receive a request from the host (①) and may check out whether an address for the received request is detected in the cache table 1414 or not (②).

When the address for the request is detected in the cache table 1414 as an address of the third DRAM 1460C (②), that is, when the address for the request corresponds to a cache hit for the third DRAM 1460C, the agent 1412 may access the third DRAM 1460C through the third memory controller (iMC2) 1420C (③), and receive the access result (④). The access result may be transferred to the host through the input/output interface 1430. For example, a read/write operation based on the address for the request may be performed on the third DRAM 1460C.

Figure 14C:
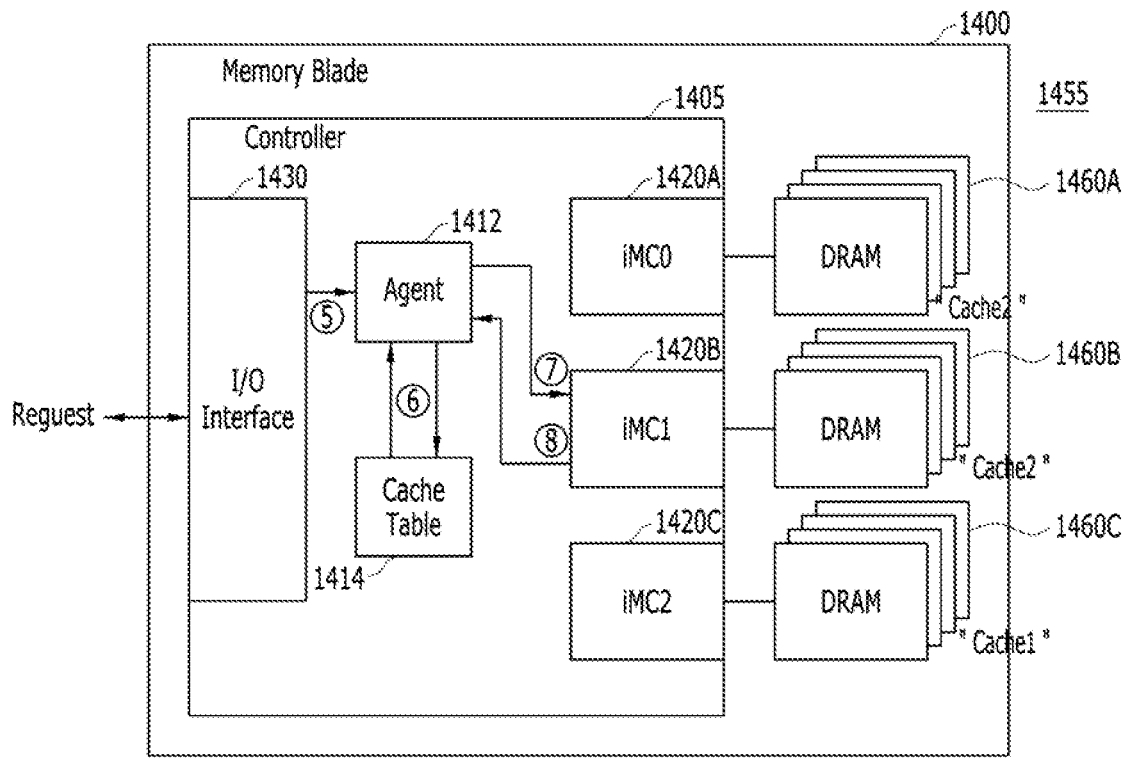

Referring to FIG. 14C, the agent 1412 may receive a request from the host (⑤) and may check out whether an address for the received request is detected in the cache table 1414 or not (⑥).

When the address for the request is detected in the cache table 1414 as an address of the second DRAM 1460B (⑥), that is, when the address for the request corresponds to a cache hit for the second DRAM 1460B, the agent 1412 may access the second DRAM 1460B through the second memory controller (iMC1) 1420B (⑦), and receive the access result (⑧). The access result may be transferred to the host through the input/output interface 1430.

Figure 14D:
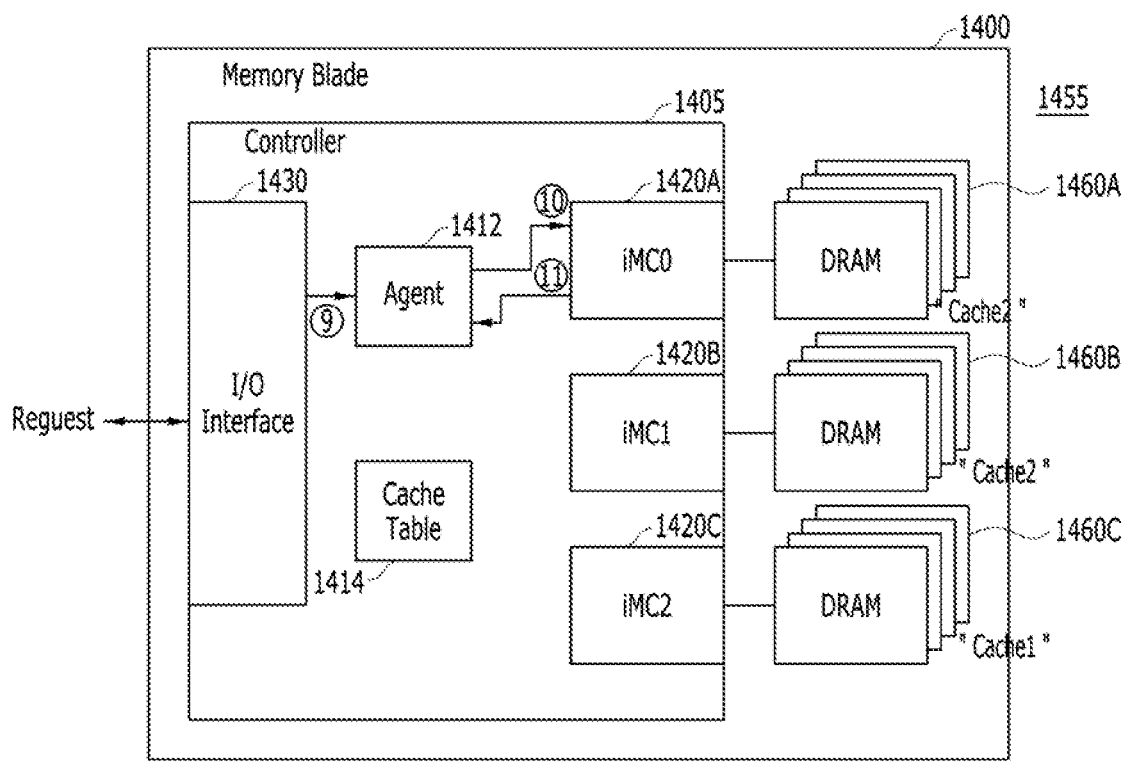

Referring to FIG. 14D, the agent 1412 may receive a request from the host (⑨) and may check out whether an address for the received request is detected in the cache table 1414 or not.

When the address for the request is not detected in the cache table 1414, that is, when the address for the request corresponds to a cache miss, the agent 1412 may access the first DRAM 1460A through the first memory controller (iMC0) 1420A (⑩), and receive the access result (⑪). The access result may be transferred to the host through the input/output interface 1430.

Figure 14E:
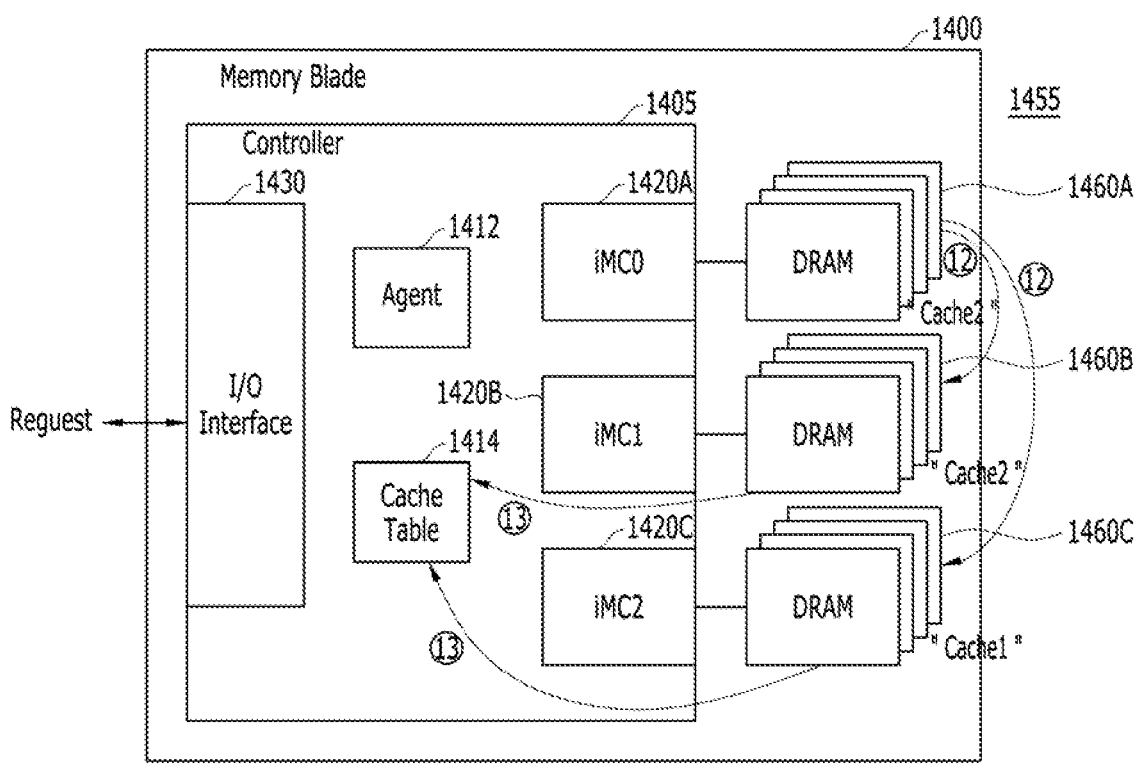

Referring to FIG. 14E, after processing the request through the first DRAM 1460A, the agent 1412 may perform a cache copy operation (⑫) and a cache table update operation (⑬). The agent 1412 may preferentially perform a cache copy operation from the first DRAM 1460A into the third DRAM 1460C, which is the main cache, and perform an update operation into the cache table 1414 according to the operation result. If there is no space in the storage space of the third DRAM 1460C, the agent 1412 may perform a cache copy operation from the first DRAM 1460A to the second DRAM 1460B, which is the sub-cache, and perform an update operation onto the cache table 1414 based on the operation result.

Figure 15:
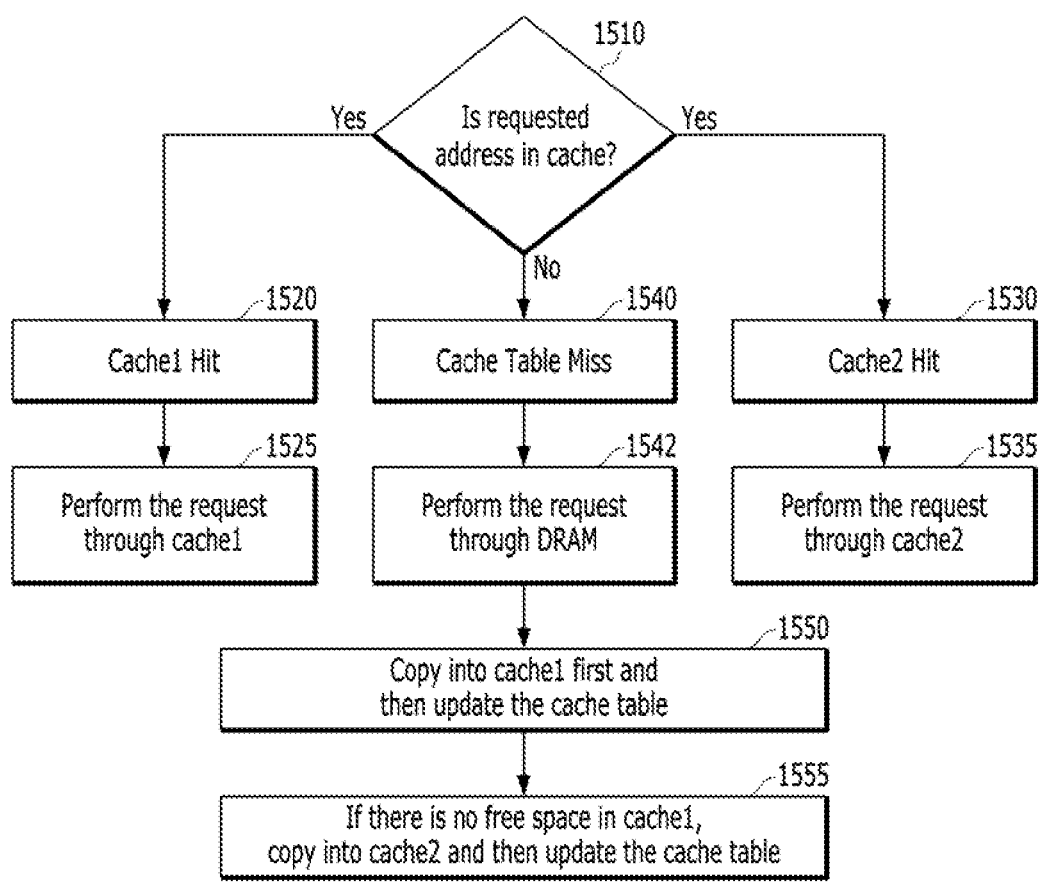
FIG. 15 is a flowchart illustrating an operation of a memory device that includes a controller in accordance with an embodiment of the present disclosure.

FIG. 15 is a flowchart illustrating an operation of a memory device including a controller in accordance with an embodiment of the present disclosure. For example, FIG. 15 illustrates an operation of the memory device 1400 that includes the controller 1405, the first memory 1460A, the second memory 1460B, and the third memory 1460C shown in FIGS. 14A to 14E.

Referring to FIG. 15, the controller 1405 may receive a request from the host, and determine whether an address for the received request is in the cache table 1414 or not in step 1510.

When the address for the received request is detected in the cache table 1414 in step 1510 (YES), the controller 1405 may determine that the address for the received request corresponds to a cache hit in steps 1520 and 1530.

When the address for the received request is a cache hit for the third memory 1460C as a first cache Cache1 in step 1520, the controller 1405 may process the request through the third memory 1460C, which is the first cache Cache1 for the first memory 1460A, in step 1525.

When the address for the received request is a cache hit for the second memory 1460B as a second cache Cache2 in step 1530, the controller 1405 may process the request through the second memory 1460B, which is the second cache Cache2 for the first memory 1460A, in step 1535.

When the address for the received request is not detected in the cache table 1414 in step 1510 (NO), the controller 1405 may determine that the address for the received request is a cache miss in step 1540. In a case of the cache miss, the controller 1405 may process the request through the first memory 1460A in step 1542.

After processing the request through the first DRAM 1460A, the controller 1405 may perform a cache copy operation and a cache table update operation. The controller 1405 may preferentially perform a cache copy operation from the first DRAM 1460A into the third DRAM 1460C, which is the first cache Cache1, and perform an update operation on the cache table 1414 according to the operation result in step 1550. If there is no space in the storage space of the third DRAM 1460C, which is the first cache Cache1, the controller 1405 may perform a cache copy operation from the first DRAM 1460A into the second DRAM 1460B, which is the second cache Cache2, and perform an update operation on the cache table 1414 based on the operation result in step 1555.

The embodiments of the present disclosure provide methods by which a converged memory device including a plurality of memories may exhibit various performances or characteristics. According to the embodiments of the present application, it is possible to provide various performances or characteristics to the converged memory device by using a volatile memory, e.g., a DRAM, for a request that requires fast data processing, or using the volatile memory as a cache for other ordinary volatile memories, in consideration that the volatile memory has characteristics that are similar to characteristics of a non-volatile memory when the volatile memory operates in a low temperature environment or a cryogenic environment.

While the present disclosure has been described with respect to the specific embodiments, it will be apparent to those skilled in the art that various changes and modifications may be made without departing from the spirit and scope of the invention as defined in the following claims.

What is claimed is:

1. A converged memory device, comprising:
   a first memory installed in an environment having a first temperature;
   a second memory installed in an environment having a second temperature that is lower than the first temperature; and
   a controller configured to selectively access the first memory or the second memory in response to a request,
   wherein the first memory and the second memory are the same kind of memory,
   wherein the controller accesses the second memory when the request has a first priority, and
   wherein the controller accesses the first memory when the request has a second priority that is lower than the first priority.

2. The converged memory device of claim 1, wherein the first temperature is a room temperature, and the second temperature is a lower temperature than the room temperature.

3. The converged memory device of claim 2, wherein the first temperature is 25° C., and the second temperature is −40° C.

4. The converged memory device of claim 1, wherein the first temperature is a room temperature, and the second temperature is a cryogenic temperature.

5. The converged memory device of claim 4, wherein the first temperature is 25° C., and the second temperature is −197° C.

6. The converged memory device of claim 1, wherein the first temperature is a lower temperature than a room temperature, and the second temperature is a cryogenic temperature.

7. The converged memory device of claim 6, wherein the first temperature is −40° C., and the second temperature is −197° C.

8. The converged memory device of claim 1, wherein the first memory has first characteristics, and
   the second memory has second characteristics, the second characteristics being superior to the first characteristics in the environment having the second temperature.

9. The converged memory device of claim 8, wherein each of the first characteristics and the second characteristics include one or more of a data access rate, a refresh period, and an on-chip leakage.

10. The converged memory device of claim 1, wherein the first memory and the second memory are mounted onto one among different memory blades, trays, and racks.

11. The converged memory device of claim 1, wherein the controller uses the second memory as a cache for the first memory.

12. The converged memory device of claim 11, wherein the controller includes:
    a cache table configured to store an address for the cache; and
    an agent configured to access the second memory when an address for the request is detected in the cache table, and to access the first memory when the address for the request is absent from the cache table.

13. The converged memory device of claim 12, wherein the controller includes:
    a first memory interface configured to interface with the first memory;
    a second memory interface configured to interface with the second memory; and
    an input/output interface configured to receive the request.

14. A converged memory device, comprising:
    a first memory installed in an environment having a first temperature;
    a second memory installed in an environment having a second temperature that is lower than the first temperature;
    a third memory installed in an environment having a third temperature that is lower than the second temperature; and
    a controller configured to selectively access one of the first memory, the second memory, and the third memory in response to a request,
    wherein the first memory, the second memory, and the third memory are the same kind of memory, and
    wherein the controller accesses the third memory when the request has a first priority, accesses the second memory when the request has a second priority that is lower than the first priority, and accesses the first memory when the request has a third priority that is lower than the second priority.

15. The converged memory device of claim 14, wherein the first temperature is a room temperature, the second temperature is a lower temperature than the room temperature, and the third temperature is a cryogenic temperature.

16. The converged memory device of claim 15, wherein the first temperature is 25° C., the second temperature is −40° C., and the third temperature is −197° C.

17. The converged memory device of claim 14, wherein the first memory has first characteristics, and the second memory has second characteristics that are superior to the first characteristics, and the third memory has third characteristics that are superior to the second characteristics in the environment having the third temperature.

18. The converged memory device of claim 17, wherein each of the first characteristics, the second characteristics, and the third characteristics include one or more of a data access rate, a refresh period, and an on-chip leakage.

19. The converged memory device of claim 14, wherein the first memory, the second memory, and the third memory are mounted onto one among different memory blades, trays, and racks.

20. The converged memory device of claim 14, wherein the controller uses the third memory as a main cache for the first memory, and uses the second memory as a sub-cache for the first memory.

21. The converged memory device of claim 20, wherein the controller includes:
    a cache table configured to store addresses for the main cache and the sub-cache; and
    a data controller configured to access the second memory or the third memory when an address for the request is detected in the cache table, and to access the first memory when the address for the request is absent from the cache table.

22. The converged memory device of claim 21, wherein the controller includes:
    a first memory interface configured to interface with the first memory;
    a second memory interface configured to interface with the second memory;
    a third memory interface configured to interface with the third memory; and
    an input/output interface configured to receive the request.

23. A method for operating a converged memory device, the method comprising:
    receiving a request; and
    selectively accessing a first memory or a second memory in response to the request,
    wherein the converged memory device includes the first memory and the second memory, the first memory being installed in an environment having a first temperature, the second memory being installed in an environment having a second temperature that is lower than the first temperature,
    wherein the first memory and the second memory are of the same kind, and
    wherein the selectively accessing a first memory or a second memory in response to the request includes:
        accessing the second memory when the request has a first priority; and
        accessing the first memory when the request has a second priority that is lower than the first priority.

24. The method of claim 23, wherein the first temperature is a room temperature, and the second temperature is a lower temperature than the room temperature.

25. The method of claim 24, wherein the first temperature is 25° C., and the second temperature is −40° C.

26. The method of claim 23, wherein the first temperature is a room temperature, and the second temperature is a cryogenic temperature.

27. The method of claim 26, wherein the first temperature is 25° C., and the second temperature is −197° C.

28. The method of claim 23, wherein the first temperature is a lower temperature than a room temperature, and the second temperature is a cryogenic temperature.

29. The method of claim 28, wherein the first temperature is −40° C., and the second temperature is −197° C.

30. The method of claim 23, wherein the first memory has first characteristics, and
    the second memory has second characteristics, the second characteristics being superior to the first characteristics in the environment having the second temperature.

31. The method of claim 30, wherein each of the first characteristics and the second characteristics include one or more of a data access rate, a refresh period, and an on-chip leakage.

32. The method of claim 23, wherein the first memory and the second memory are mounted onto one among different memory blades, trays and racks.

33. The method of claim 23, wherein the second memory is used as a cache for the first memory.

34. The method of claim 33, wherein the selectively accessing a first memory or a second memory in response to the request includes:
    accessing the second memory when an address for the request is an address for accessing the second memory; and
    accessing the first memory when the address for the request is an address for accessing the first memory.

35. A method for operating a converged memory device, the method comprising:
    receiving a request; and
    selectively accessing one of a first memory, a second memory, and a third memory in response to the request,
    wherein the converged memory device includes the first memory, the second memory, and the third memory, the first memory being installed in an environment having a first temperature, the second memory being installed in an environment having a second temperature that is lower than the first temperature, and the third memory being installed in an environment having a third temperature that is lower than the second temperature,
    wherein the first memory, the second memory, and the third memory are the same kind of memory, and
    wherein the selectively accessing one of a first memory, a second memory, and a third memory in response to the request includes:
        accessing the third memory when the request has a first priority;
        accessing the second memory when the request has a second priority that is lower than the first priority; and
        accessing the first memory when the request has a third priority that is lower than the second priority.

36. The method of claim 35, wherein the first temperature is a room temperature, the second temperature is a lower temperature than the room temperature, and the third temperature is a cryogenic temperature.

37. The method of claim 36, wherein the first temperature is 25° C., the second temperature is −40° C., and the third temperature is −197° C.

38. The method of claim 35, wherein the first memory has first characteristics, the second memory has second characteristics, the second characteristics being superior to the first characteristics in the environment having the second temperature, and
    the third memory has third characteristics, the third characteristics being superior to the second characteristics in the environment having the third temperature.

39. The method of claim 38, wherein each of the first characteristics, the second characteristics, and the third characteristics include one or more of a data access rate, a refresh period, and an on-chip leakage.

40. The method of claim 35, wherein the first memory, the second memory, and the third memory are mounted onto one among different memory blades, trays and racks.

41. The method of claim 35, wherein the third memory is used as a main cache for the first memory, and the second memory is used as a sub-cache for the first memory.

42. The method of claim 41, wherein the selectively accessing one of a first memory, a second memory, and a third memory in response to the request includes:
- accessing the third memory when an address for the request is an address for accessing the third memory;
- accessing the second memory when the address for the request is an address for accessing the second memory; and
- accessing the first memory when the address for the request is an address for accessing the first memory.

* * * * *